(12) United States Patent
Wang et al.

(10) Patent No.: US 8,298,837 B2
(45) Date of Patent: Oct. 30, 2012

(54) SYSTEM AND METHOD FOR INCREASING PRODUCTIVITY OF ORGANIC LIGHT EMITTING DIODE MATERIAL SCREENING

(75) Inventors: Yun Wang, San Jose, CA (US); Tony P. Chiang, Campbell, CA (US); Chi-I Lang, Cupertino, CA (US)

(73) Assignee: Intermolecular, Inc., San Jose, CA (US)

( * ) Notice: Subject to any disclaimer, the term of this patent is extended or adjusted under 35 U.S.C. 154(b) by 56 days.

(21) Appl. No.: 13/072,083

(22) Filed: Mar. 25, 2011

(65) Prior Publication Data

US 2012/0244644 A1    Sep. 27, 2012

(51) Int. Cl.
H01L 21/00 (2006.01)
(52) U.S. Cl. .................. 438/5; 506/23; 438/14; 438/18; 438/478; 438/193; 438/763; 438/7; 257/48; 257/E21.521; 257/E29.166
(58) Field of Classification Search .................. None
See application file for complete search history.

(56) References Cited

U.S. PATENT DOCUMENTS

2007/0202614 A1*  8/2007  Chiang et al. .................. 438/14

OTHER PUBLICATIONS

Thelakkat et al. ("Materials Screening and Combinatorial Development of Thin Film multilayer Electro-Optical Devices", Macromol. Rapid Commun., 25, pp. 204-223, 2004).*

* cited by examiner

Primary Examiner — Julio J Maldonado
Assistant Examiner — Yasser Abdelaziez

(57) ABSTRACT

A system and method of increasing productivity of OLED material screening includes providing a substrate that includes an organic semiconductor, processing regions on the substrate by combinatorially varying parameters associated with the OLED device production on the substrate, performing a first characterization test on the processed regions on the substrate to generate first results, processing regions on the substrate in a combinatorial manner by varying parameters associated with the OLED device production on the substrate based on the first results of the first characterization test, performing a second characterization test on the processed regions on the substrate to generate second results, and determining whether the substrate meets a predetermined quality threshold based on the second results.

10 Claims, 21 Drawing Sheets

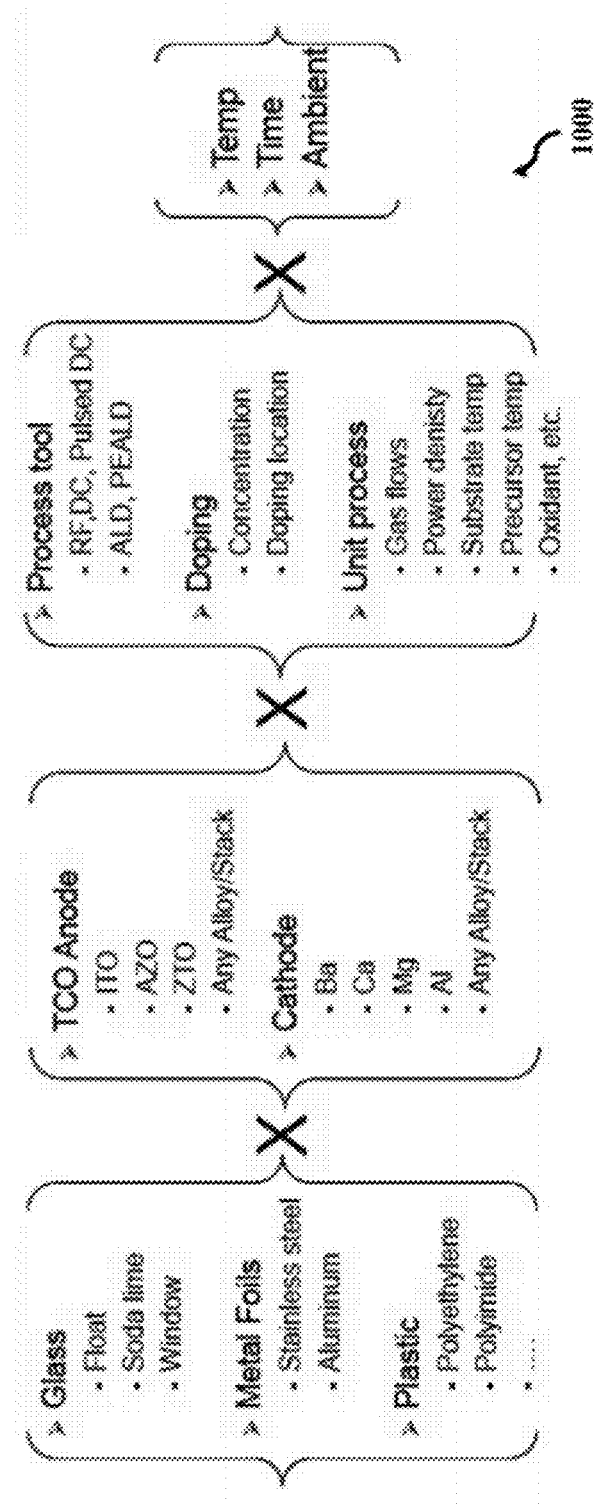
FIG. 1
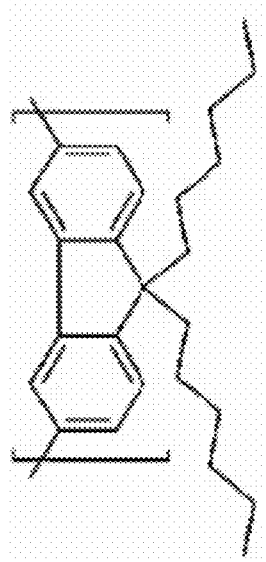
FIG. 4
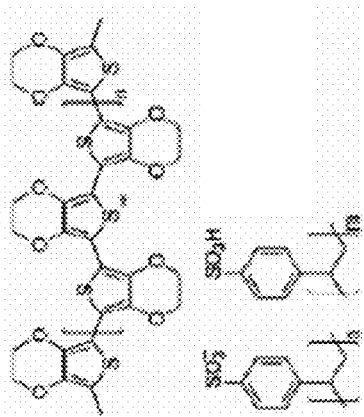
FIG. 2
FIG. 3

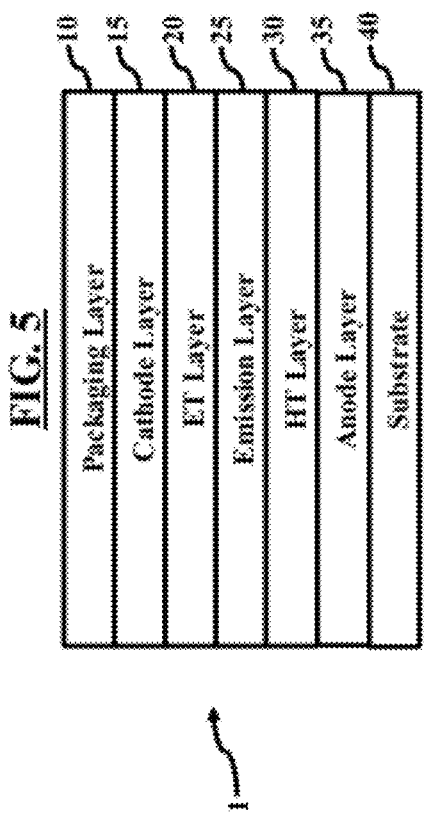
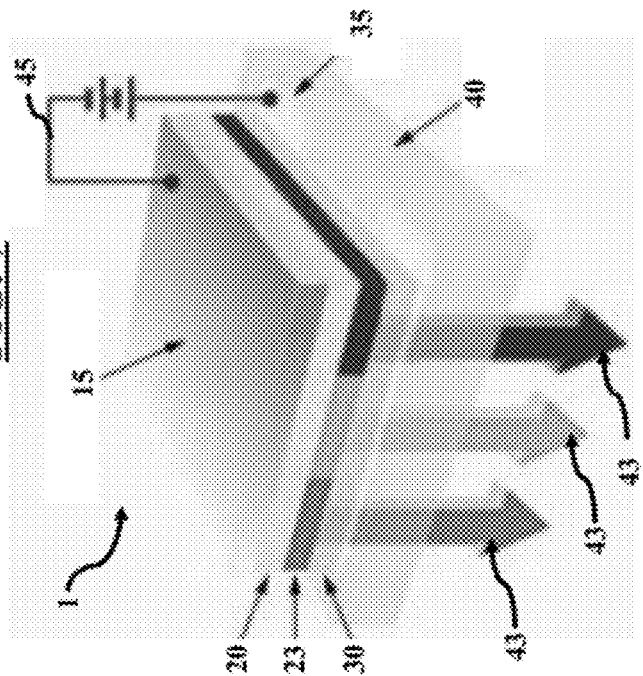
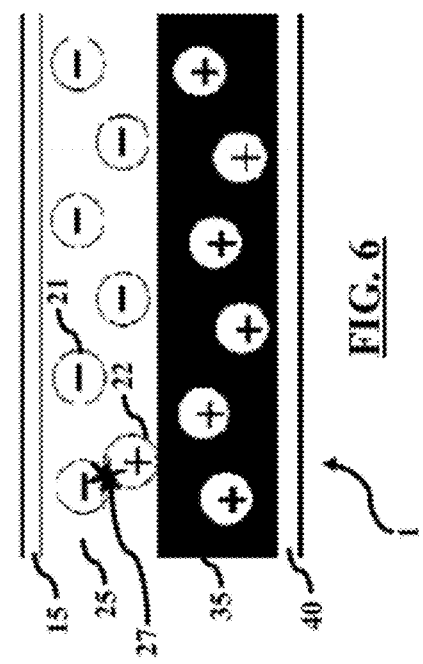
FIG. 5
FIG. 6
FIG. 7

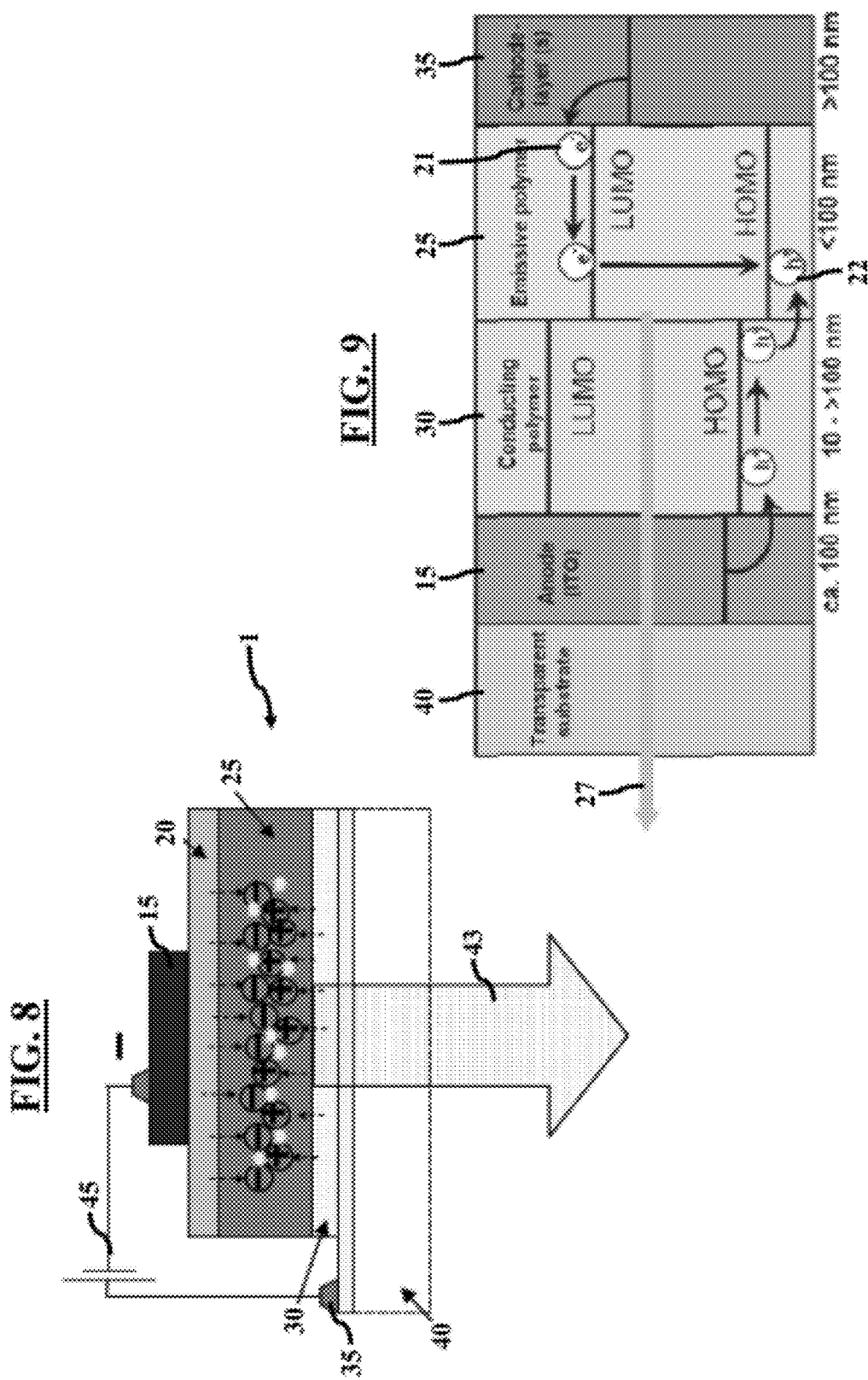

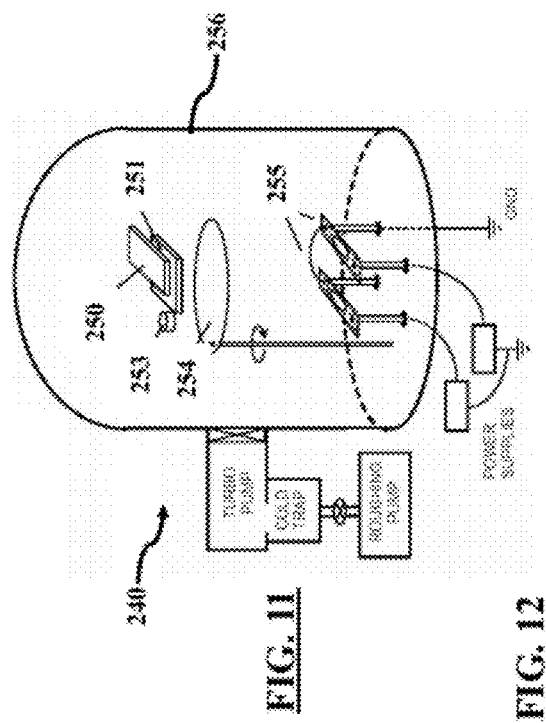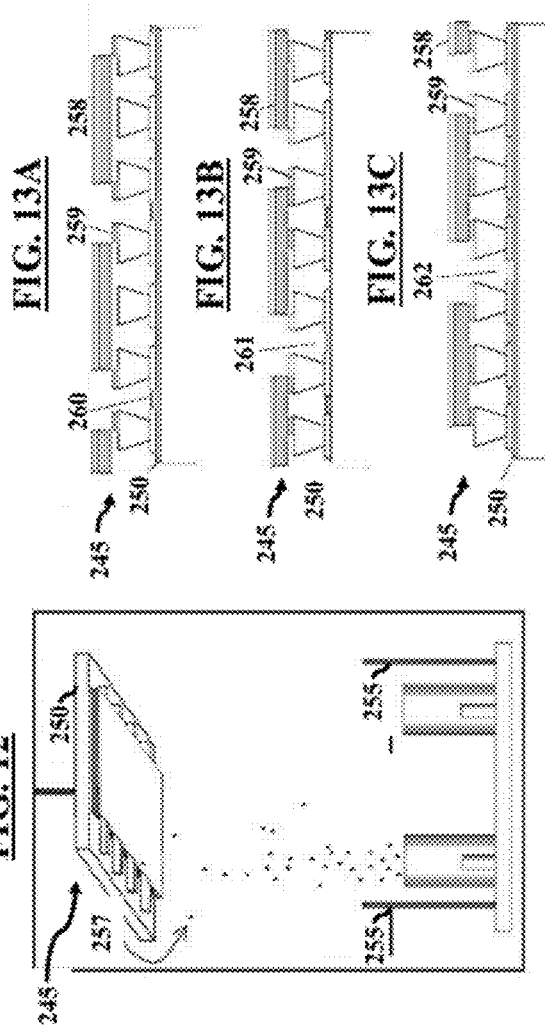

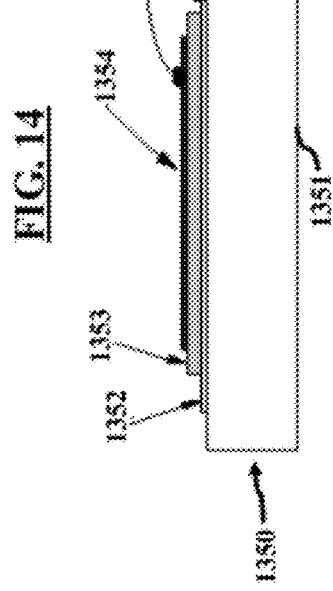
FIG. 14
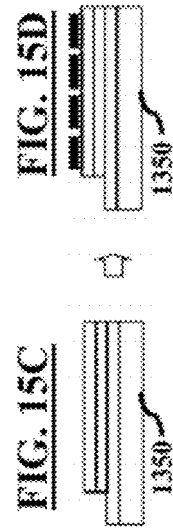 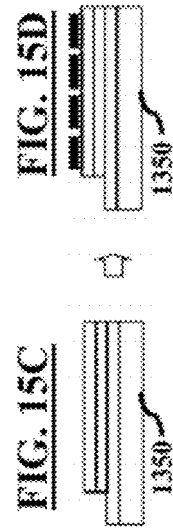 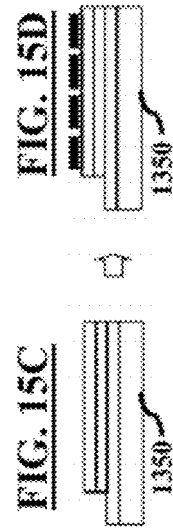 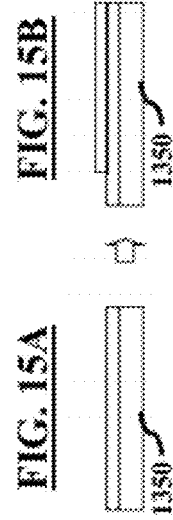
FIG. 15A  FIG. 15B  FIG. 15C  FIG. 15D
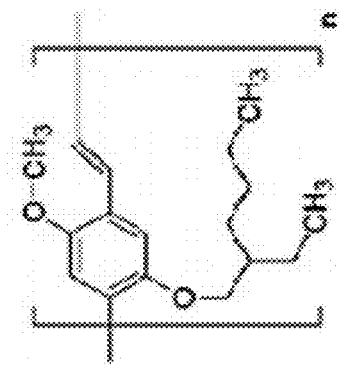
FIG. 16
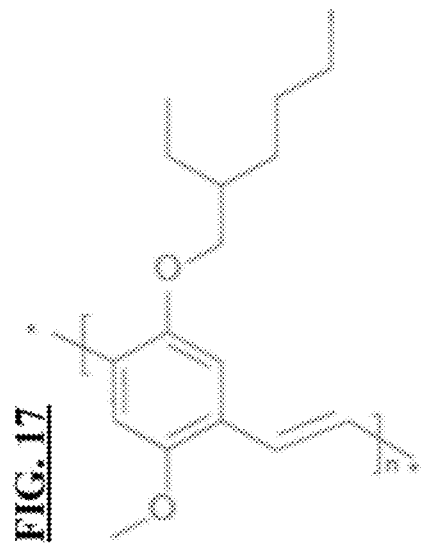
FIG. 17

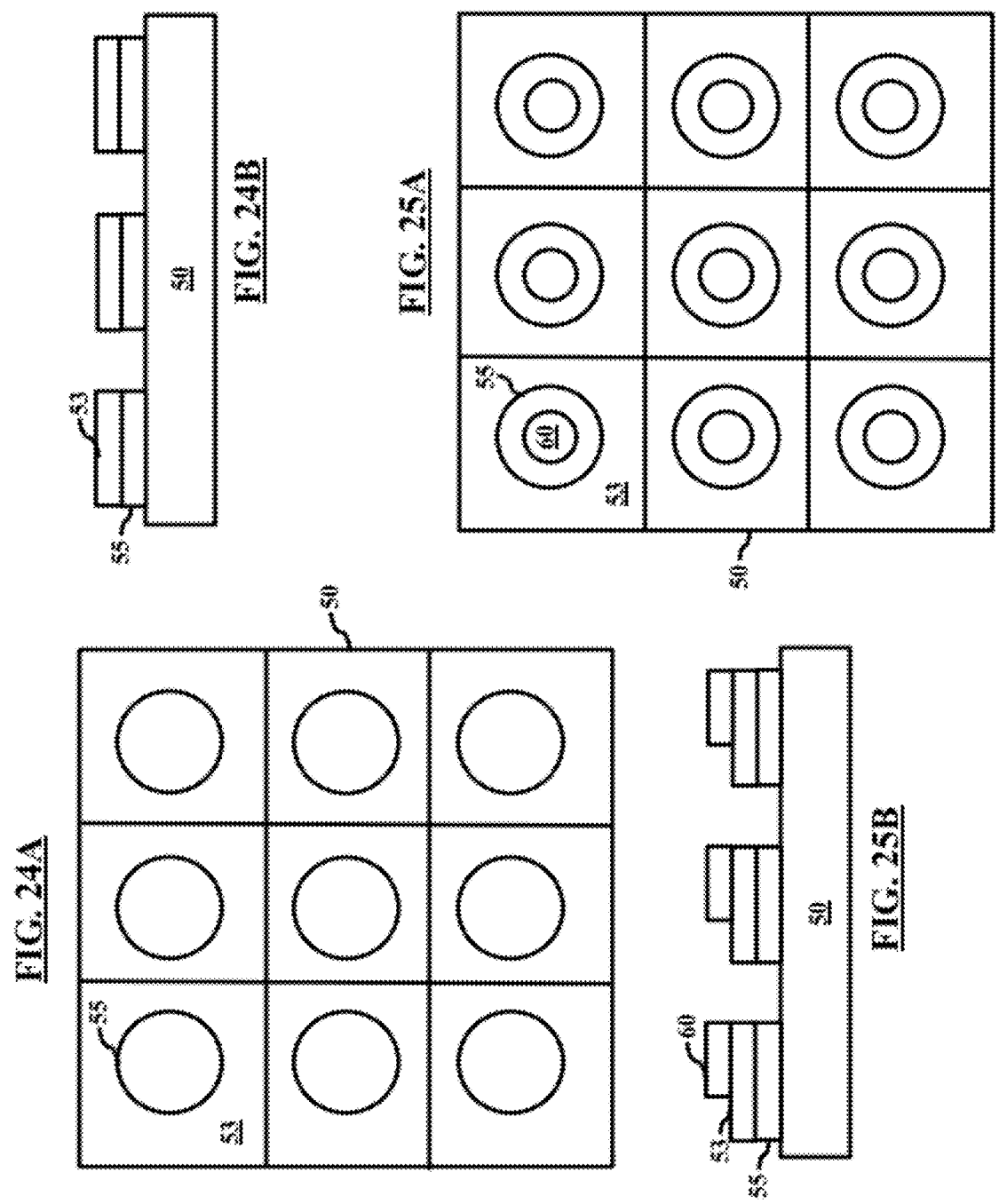

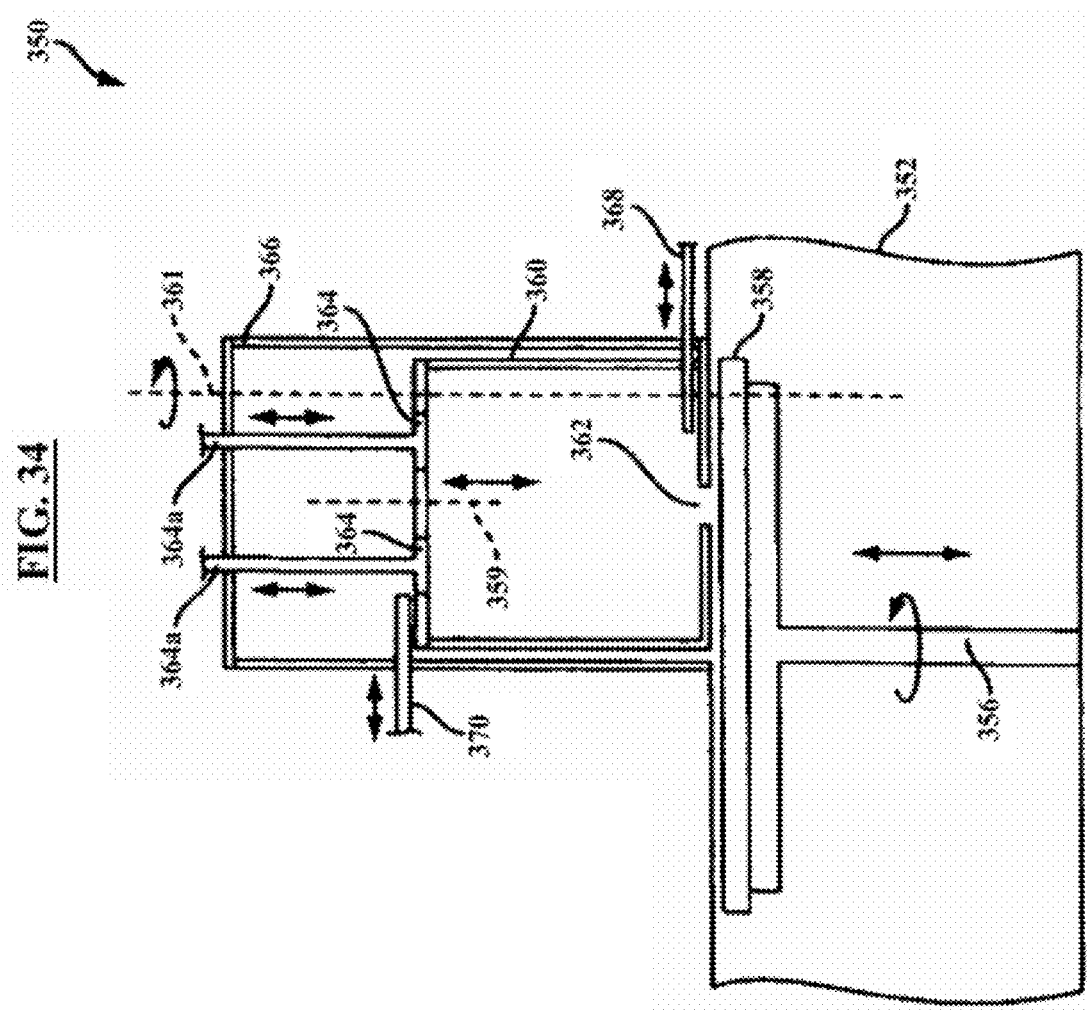

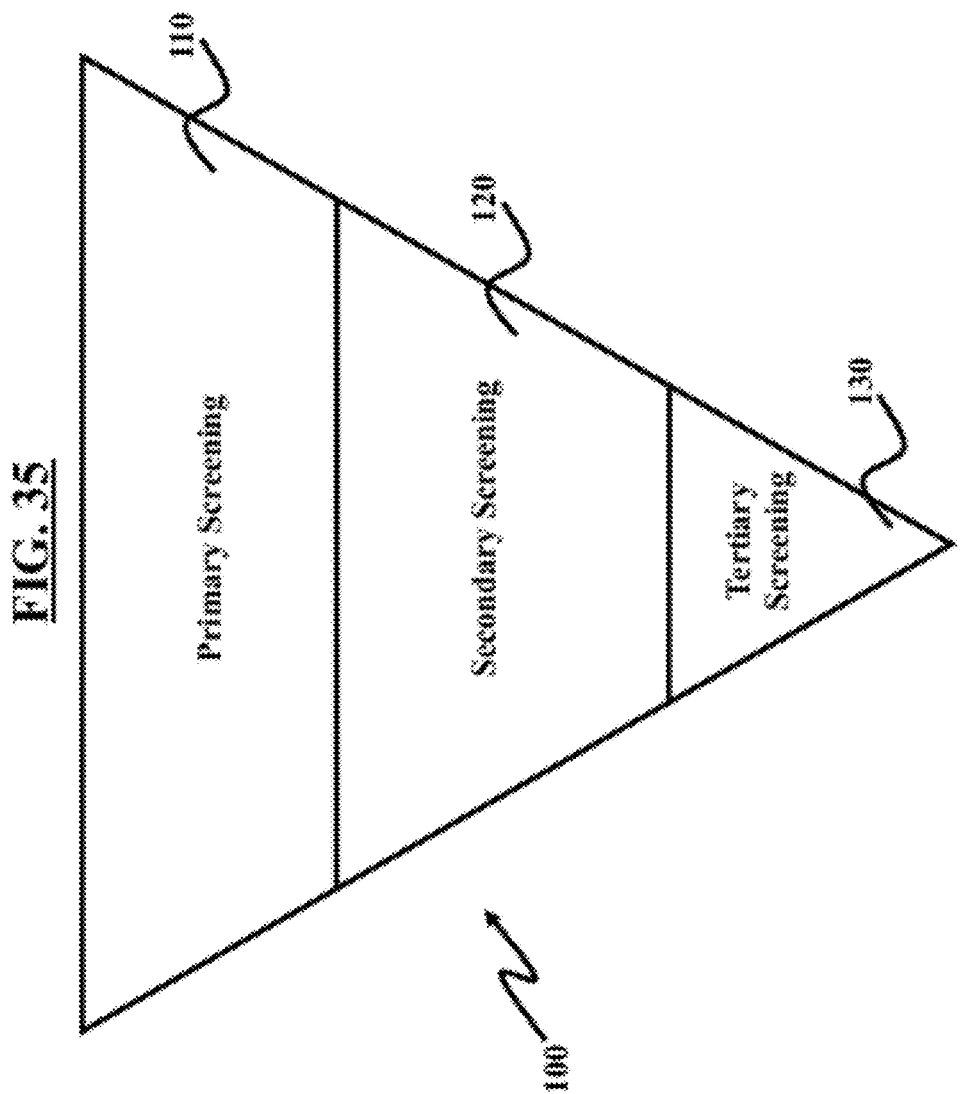

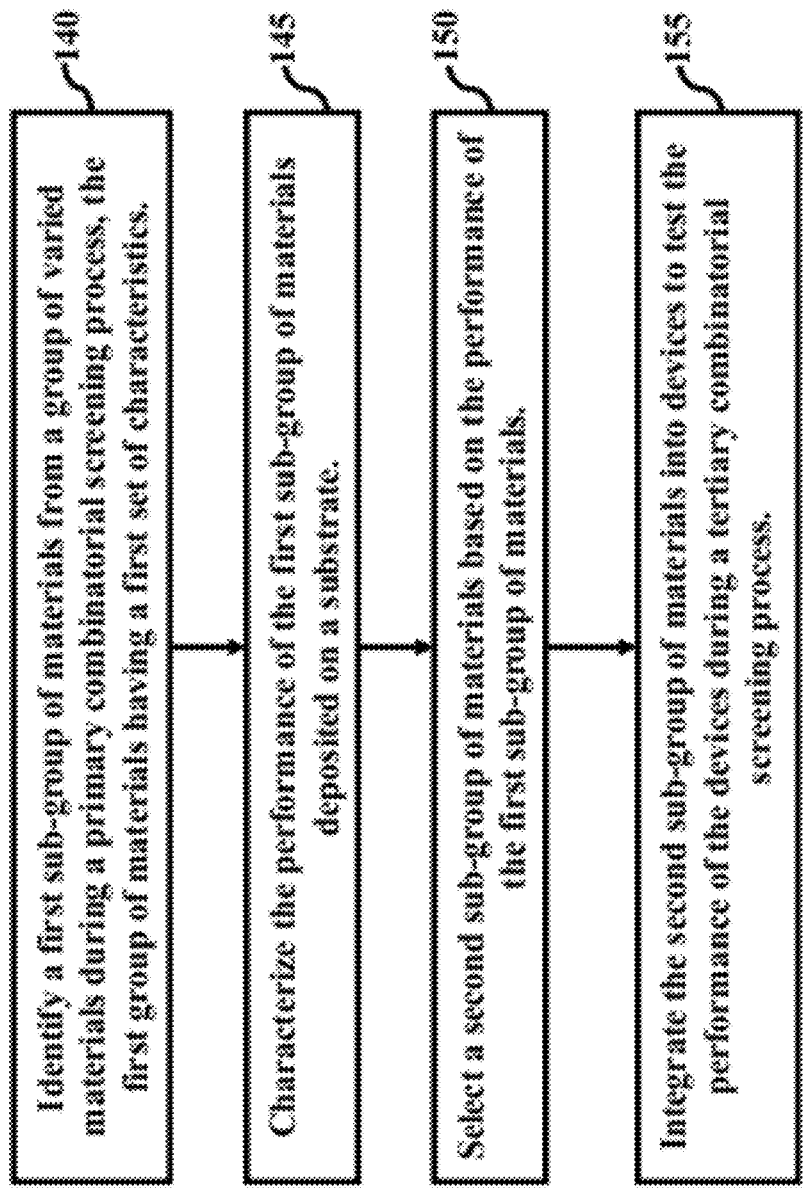

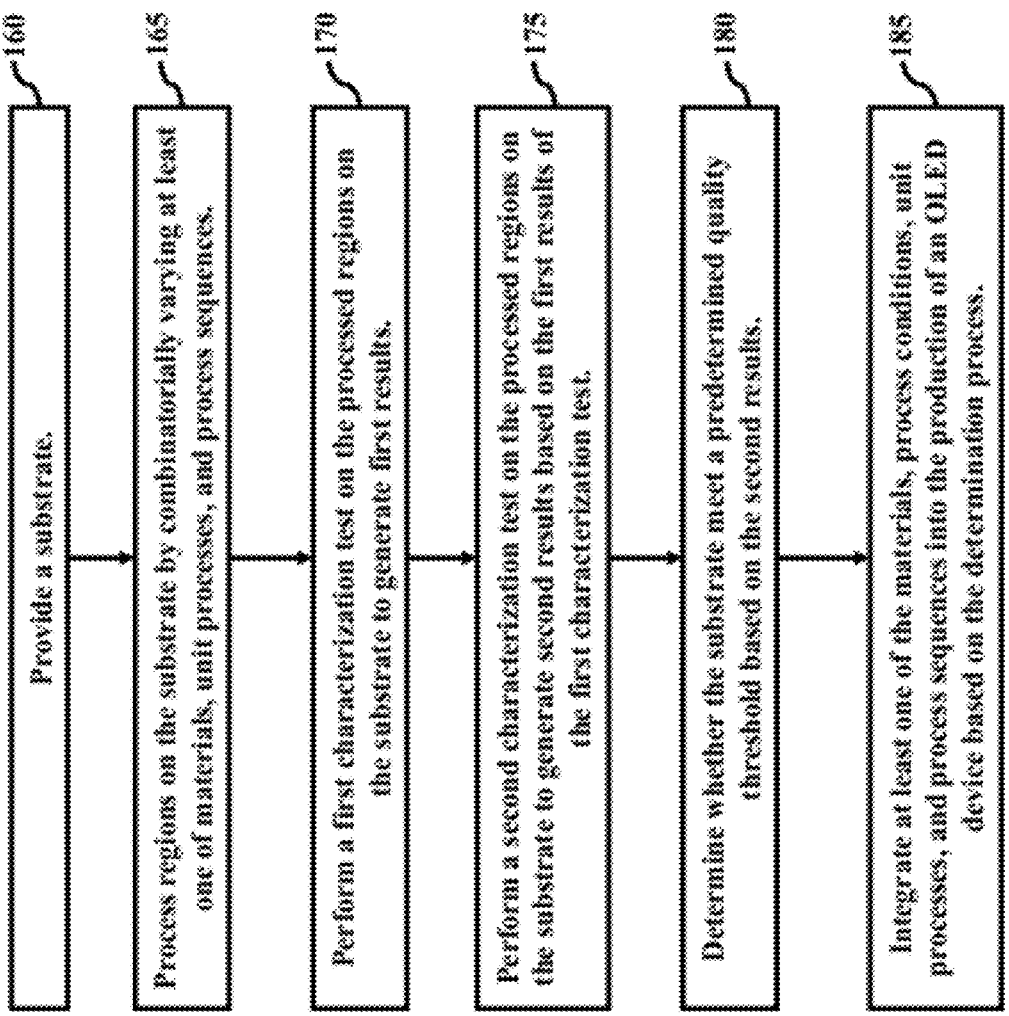

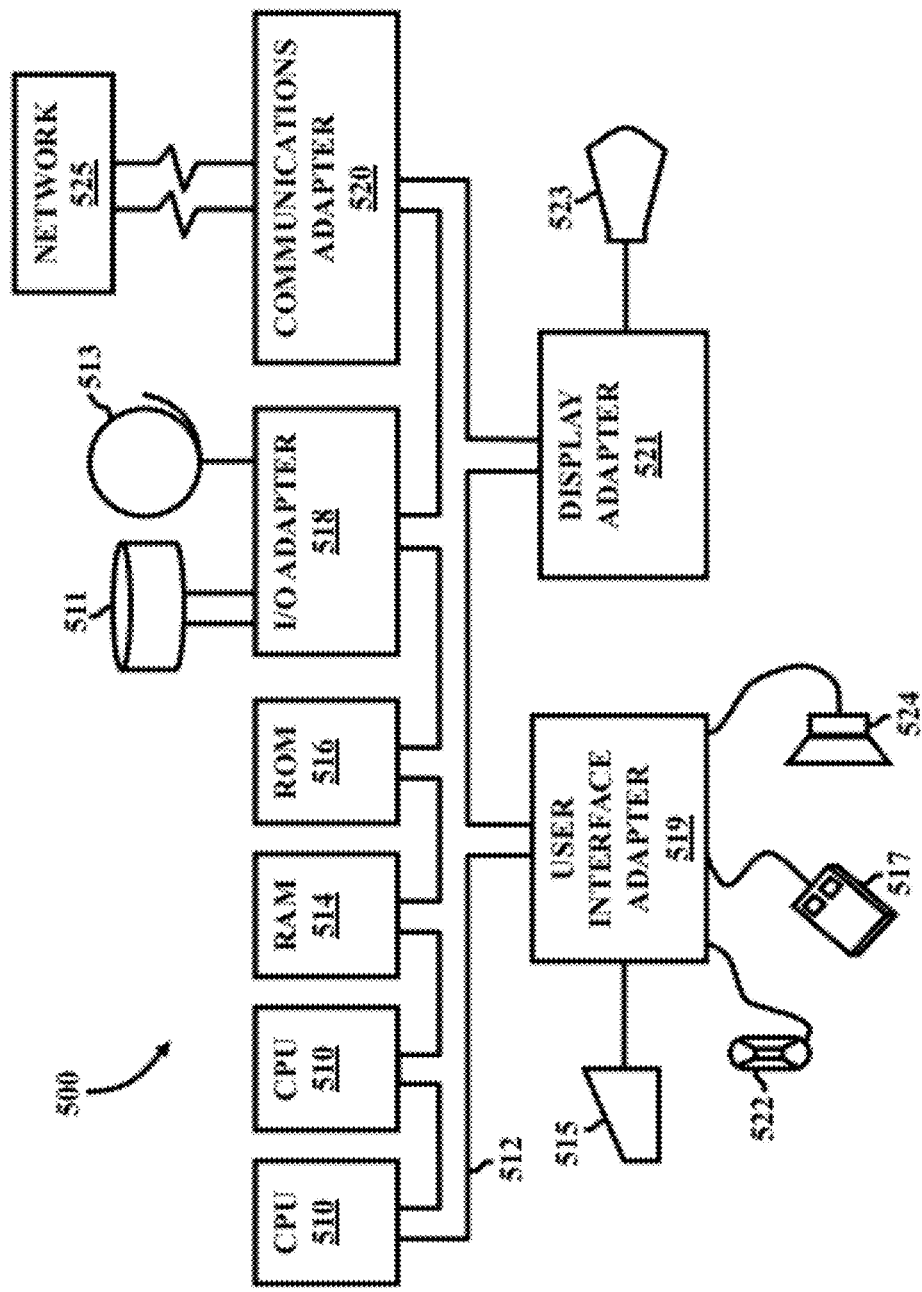

SYSTEM AND METHOD FOR INCREASING PRODUCTIVITY OF ORGANIC LIGHT EMITTING DIODE MATERIAL SCREENING

BACKGROUND

1. Technical Field

The embodiments herein generally relate to organic light emitting diode processing and characterization, and more specifically, to a high throughput combinatorial screening through novel substrates and techniques.

2. Description of the Related Art

The ability to process uniformly across a monolithic substrate and/or across a series of monolithic substrates is advantageous for manufacturing efficiency and cost effectiveness, as well as repeatability and control. However, uniform processing across an entire substrate can be disadvantageous when optimizing, qualifying, or investigating new materials, new processes, and/or new process sequence integration schemes, since the entire substrate is nominally made the same using the same materials, processes, and process sequence integration scheme. In conventional processing systems, each processed substrate generally represents, in essence, only one possible variation per substrate. Thus, the full substrate uniform processing under conventional processing techniques results in fewer data points per substrate, longer times to accumulate a wide variety of data, and higher costs associated with obtaining such data.

For example, in current systems, indium tin oxide (ITO) is used as an anode material in organic light emitting diode (OLED) devices. In general, OLED devices use an emissive electroluminescent layer made of an organic semiconductor to emit light in response to an electric current. For example, light is emitted in the emissive electroluminescent layer as an applied voltage causes a current of electrons to flow from the anode to a cathode. In OLED applications, the anode material is typically transparent and thereby allows the light emitted from the emissive electroluminescent layer to pass therethrough. Since ITO is transparent, this makes ITO a suitable material in limited situations. ITO, however, has several drawbacks, including a high manufacturing cost that, in turn, affects the price of devices based on OLED technology and thereby affects the ability of OLED-based devices to fully realize their potential in the marketplace. The high manufacturing cost of ITO is attributed to, for example, the cost of indium, special equipment capable of accommodating the fragility of ITO, and the cost of deposition equipment, wherein ITO requires deposition in a vacuum.

What is needed is an alternative to ITO that is also a transparent conductor. Significant development gain can be obtained, for example, by identifying transparent conductors that can be deposited efficiently and cost effectively. Conventional research and development, however, is slow and costly. For example, to know the result of each condition (e.g., as part of a design of experiments matrix), one wafer or coupon with many follow-up steps is required, which under current technology is very complicated as well as cost inefficient. In particular, OLED companies conduct research and development (R&D) on full wafer processing through the use of split lots, as the deposition systems are designed to support this processing scheme. This approach has resulted in high R&D costs and the inability to conduct extensive experimentation in a timely and cost effective manner. Therefore, what is needed is an efficient experimental methodology to identify new transparent conductors.

BRIEF DESCRIPTION OF THE DRAWINGS

The embodiments herein will be better understood from the following detailed description with reference to the drawings, in which:

FIG. 1 illustrates a schematic diagram of a design of experiments (DOE) matrix according to an embodiment herein;

FIG. 2 illustrates a chemical diagram of poly(3,4-ethylenedioxythiophene) according to an embodiment herein;

FIG. 3 illustrates a chemical diagram of poly(styrenesulfonate) according to an embodiment herein;

FIG. 4 illustrates a chemical diagram of poly(9,9-di-n-hexylfluorene) according to an embodiment herein;

FIG. 5 illustrates a schematic diagram of an example OLED device according to an embodiment herein;

FIG. 6 illustrates another schematic diagram of an OLED device according to an embodiment herein;

FIG. 7 illustrates yet another schematic diagram of an OLED device according to an embodiment herein;

FIG. 8 illustrates a schematic diagram of the OLED device in operation according to an embodiment herein;

FIG. 9 illustrates an energy diagram of an OLED device according to an embodiment herein;

FIG. 11 illustrates the preparation of an SM-OLED device according to an embodiment herein;

FIG. 12 illustrates full color patterning of an OLED device with small molecules according to an embodiment herein;

FIG. 13A through 13C further illustrate full color patterning of an OLED device with small molecules according to an embodiment herein;

FIG. 14 illustrates a schematic diagram of a polymer LED (PLED) device according to an embodiment herein;

FIGS. 15A through 15D illustrate schematic diagrams of fabricating a PLED device according to an embodiment herein;

FIG. 16 illustrates a chemical diagram of MEH:PPV according to an embodiment herein;

FIG. 17 illustrates another chemical diagram of MEH:PPV according to an embodiment herein;

FIG. 24A illustrates another top down view of a substrate used to form test structures and process conditions according to an embodiment herein;

FIG. 24B illustrates a cross-sectional view of the substrate shown in FIG. 24A according to an embodiment herein;

FIG. 25A illustrates yet another top down view of a substrate used to form test structures and process conditions according to an embodiment herein;

FIG. 25B illustrates a cross-sectional view of the substrate shown in FIG. 25A, according to an embodiment herein;

FIG. 34 illustrates a schematic diagram of a combinatorial dry processing apparatus according to an embodiment herein;

FIG. 35 illustrates a schematic diagram of a combinatorial screening process according to an embodiment herein;

FIG. 36 is a flow diagram illustrating a method according to an embodiment herein;

FIG. 37 is another flow diagram illustrating a method according to an embodiment herein; and FIG. 38 illustrates a schematic diagram of a computer architecture used in accordance with the embodiments herein.

DETAILED DESCRIPTION

Figure 10D:
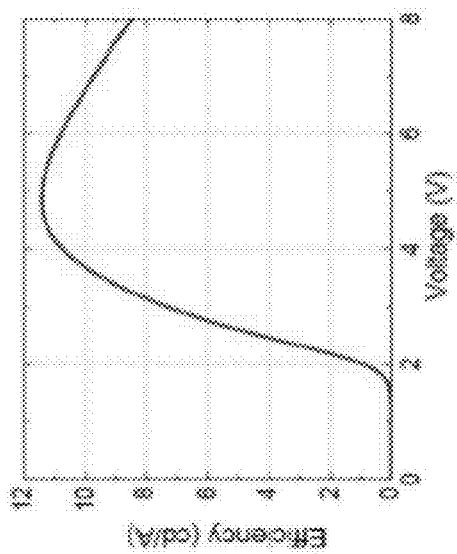
FIGS. 10A through 10D illustrate the optoelectronic characteristics of an OLED device according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a high performance combinatorial system and method that saves both operator resources as well as test time, and offers a key function for high throughput and combinatorial research. Referring now to the drawings, and more particularly to FIGS. 1 through 38, where similar reference characters denote corresponding features consistently throughout the figures, there are shown embodiments.

R&D into new areas of technology are only as good as the systems and methods available during the discovery process. For example, implementing a design of experiments (DOE) matrix using conventional systems in OLED development is a time-consuming and labor-intensive process. As described below, however, a technician's burden can be minimized by test automation. An example DOE matrix 1000 is shown in FIG. 1. According to an embodiment herein, as described in further detail below, implementation of the DOE matrix 1000 shown in FIG. 1 is achieved with minimal use of a technician's resources and at significantly improved efficiency (e.g., in terms of both time and money). Moreover, the test time can be further reduced by parallel testing different test sites by measuring multiple sites at the same time instead of measuring one at a time used in conventional systems.

A combinatorial screening process, as provided by the embodiments herein, includes varying at least one of OLED materials, process conditions, unit processes, and process sequences associated with selecting optimal materials and manufacturing sequences for producing OLED devices. Moreover, the use of the combinatorial processing described represents one of many valuable applications of the embodiments herein.

For example, the manufacturing of OLED devices, organic semiconductor devices, integrated circuits (IC) devices, microelectromechanical systems (MEMS), nanoelectromechanical systems (NEMS), flat panel displays, optoelectronics devices, data storage devices, magneto electronic devices, magneto optic devices, packaged devices, solar devices, and the like entails the integration and sequencing of many unit processing steps. OLED manufacturing, for example, typically includes a series of processing steps such as cleaning, surface preparation, deposition, and other related unit processing steps. The precise sequencing and integration of the unit processing steps enable the formation of functional devices meeting desired performance specifications such as speed, power consumption, yield, and reliability. Methods of increasing productivity and decreasing manufacturing costs include the use of batch reactors whereby multiple monolithic substrates can be processed in parallel. In these processing steps, a monolithic substrate or batch of monolithic substrates are processed uniformly; i.e., in the same fashion with the same resulting physical, chemical, electrical, and the like properties across a given monolithic substrate.

According to an embodiment herein, an OLED device is simply described as a light-emitting solid-state device derived from an organic semiconductor. Broadly defined, an organic semiconductor is an organic material with semiconductor properties, whereas conventional light emitting diodes are derived from inorganic semiconductors (e.g., silicon). Organic semiconductors represent an exciting new direction for semiconductor physics. With respect to organic semiconductors, single molecules, oligomers, and organic polymers often exhibit semiconductivity. For example, semiconducting small molecules (e.g., aromatic hydrocarbons) broadly include the polycyclic aromatic compounds pentacene, anthracene, and rubrene. In addition, polymeric organic semiconductors broadly include poly(3-hexylthiophene), poly(p-phenylene vinylene), as well as polyacetylene and its derivatives. FIGS. 2 through 4, with reference to FIG. 1, illustrate examples of polymeric organic semiconductors. In FIG. 2, for example, a chemical diagram of poly(3, 4-ethylenedioxythiophene) (hereinafter "PEDOT") is shown and in FIG. 3, a chemical diagram of poly(styrenesulfonate) (hereinafter "PSS") is shown. Moreover, in FIG. 4, a chemical diagram of poly(9,9-di-n-hexylfluorene) (hereinafter "PDHF") is shown. Implementation of these compounds in a DOE matrix 1000 (as shown in FIG. 1, for example) is described in further detail below.

In a broad, general sense, organic semiconductors may be described in two major overlapping classes: organic charge-transfer complexes and various linear-backbone conductive polymers derived from polyacetylene. In general, charge-transfer complexes often exhibit similar conduction mechanisms to inorganic semiconductors, at least locally. Such mechanisms arise from the presence of hole and electron conduction layers separated by a band gap. Examples of linear backbone organic semiconductors include polyacetylene itself and its derivatives polypyrrole and polyaniline. As with inorganic amorphous semiconductors, tunneling, localized states, mobility gaps, and phonon-assisted hopping also contribute to conduction, particularly in polyacetylenes. Moreover, similar to inorganic semiconductors, organic semiconductors can be doped. For example, organic metals, such as polyaniline (Ormecon) and PEDOT:PSS, may be used when doping organic semiconductors.

As indicated above, organic semiconductors represent an exciting new direction for semiconductor physics, and OLEDs are leading the way. For example, OLED applications include OLED televisions, computer screens, lighting, cell phone screens, keyboards, and flexible displays. Future applications of OLEDs include flexible cell phones, wallpaper and window lighting. These applications utilize the advantages OLED have over conventional light emitting diodes (LED) and liquid crystal displays (LCD). These advantages include: thinner, lighter and more flexible plastic substrates, instead of simply glass substrates; higher resolution (<5 μm pixel size) and fast switching (1-10 ms); no requirement of a backlight because the device generates light; low voltage, low power, and an emissive source; robust design (e.g., using plastic substrates); larger-sized displays; brighter light, with good daylight visibility; and larger viewing angles (e.g., 170°).

FIGS. 5 through 7, with reference to FIGS. 1 through 4, illustrate schematic diagrams of an OLED device 1 according to an embodiment herein. As shown in FIG. 5, OLED device 1 includes a packaging layer 10, a cathode layer 15, an electron transport (ET) layer 20, an emission layer 25, a hole transport (HT) layer 30, and an anode layer 35 stacked atop substrate 40. In addition, while not shown in FIG. 5, ET layer 20 may be combined with emission layer 25 to form a combined ET/emission layer. FIG. 6 illustrates another schematic diagram of OLED device 1, where cathode layer 15 releases some of its electrons (e.g., electron 21) into emissive layer 25 in response to an applied voltage and, according to an embodiment herein, may or may not be transparent according to the type of OLED device 1, as described above. In addition, emission layer 25 transports electrons (e.g., electron 21), as shown in FIG. 6, and is where light is produced (e.g., photon 27) in OLED device 1. According to an embodiment herein, emission layer 25 includes organic plastic molecules or conductive polymers, as described above. While not shown, according to one embodiment herein, a conducting layer also includes organic plastic molecules or conductive polymers and transports "holes" (e.g., hole 22) from anode 35, where anode 35 removes electrons (e.g., electron 21). In addition, according to an embodiment herein, substrate 40 may include at least one of clear plastic, glass, or foil and supports OLED device 1. FIG. 7 illustrates a perspective view of OLED device 1 and further includes three organic emitters 23 that emit light 43 of a particular color (e.g., red, yellow, blue, etc.) when power is applied (e.g., from power source 45, where power source 45 is between approximately 2 and 10V DC according to one embodiment).

In general, OLED devices (e.g., OLED device 1) rely on organic materials (e.g., organic semiconductors, as described above) that give off light when an electric current is applied. FIG. 8, with reference to FIGS. 1 through 7, illustrates a schematic diagram of the OLED device 1 in operation and FIG. 9, with reference to FIGS. 1 through 8, illustrates an energy diagram of an OLED device (e.g., OLED device 1) in operation. As shown in FIG. 8, electrons (e.g., electron 21, shown in FIG. 6) are injected into OLED device 1 from cathode layer 15 and holes (e.g., hole 23, shown in FIG. 6) are injected into OLED device 1 from anode layer 35. Emission layer 25 transports and supports the radiative recombination of the electron-hole pairs. FIG. 9 illustrates a diagram describing the operation of OLED device 1 from an energy perspective. During operation, a voltage is applied across OLED device 1 such that anode layer 25 is positive with respect to cathode layer 15. A current of electrons flows through OLED device 1 from cathode layer 15 to anode 35, as electrons 21 are injected into the lowest unoccupied molecular orbital (LUMO) of emissive layer 35 at cathode layer 15 and withdrawn from the highest occupied molecular orbital (HOMO) at anode layer 35 to create holes 22. As electrostatic forces bring electrons 21 and holes 22 towards each other in emissive layer 25 and results in an emission of radiation (e.g., photon 27) whose frequency is in the visible region. The frequency of this radiation depends on the difference in energy between the HOMO and LUMO.

Figure 10C:
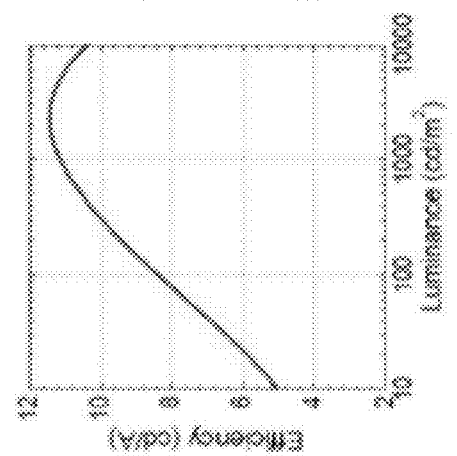
Figure 10A:
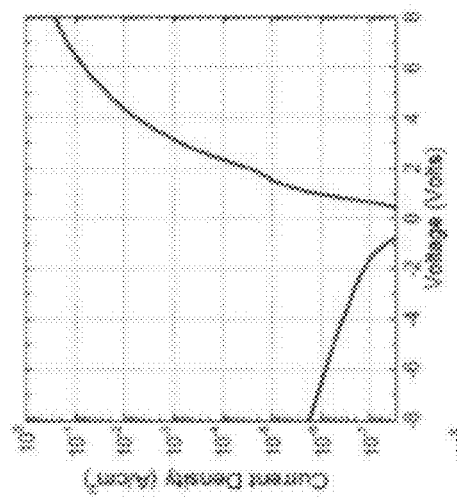
Figure 10B:
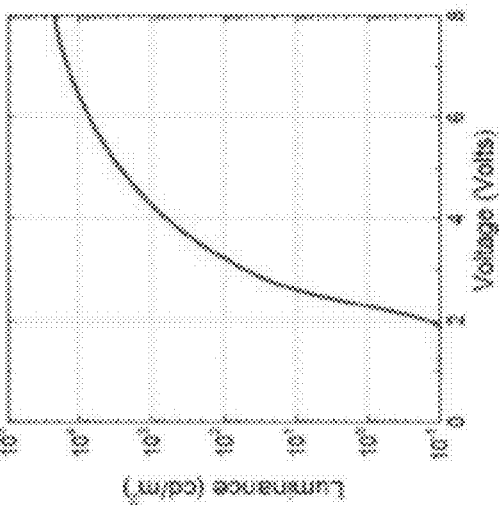

FIGS. 10A through 10D illustrate the optoelectronic characteristics of an OLED device (e.g., OLED device 1). For example, FIGS. 10A and 10B are luminance-current-voltage diagrams, while FIGS. 10C and 10D are efficiency-luminance-voltage diagrams. As shown in FIGS. 10A through 10D, luminance is the luminous intensity per unit area projected in a given direction. Measurements are provided in the candela per square meter ($cd/m^2$). Other measurement metrics may also be used, such as the nit (where 1 nit=1 $cd/m^2$) and the footlambert (fL, where 1 fL=3.426 $cd/m^2$). Generally, the current density is depicted as a function of voltage in FIG. 10A; luminance is depicted as a function of voltage in FIG. 10B; and efficiency is depicted as a function of luminance and voltage in FIGS. 10C and 10D, respectively.

FIG. 11, with reference to FIGS. 1 through 10D, illustrates a schematic diagram of a small molecule OLED (SM-OLED) apparatus 240 during preparation, while FIGS. 12 and 13A through 13C illustrate another schematic diagram of an SM-OLED device 245 during preparation. As shown in FIG. 11, a simple, vacuum-based, SM-OLED preparation apparatus 240 is shown to include a substrate 250, a substrate holder 251, a thickness monitor 253, a shutter 254, an a plurality of source boats 255—all of which are held within vacuum chamber 256. According to one embodiment herein, vacuum chamber 256 maintains a pressure of approximately >$10^{-5}$ torr. In addition, source boats 255 hold organic materials to form a thin film on substrate 250. According to one embodiment herein, substrate 250 includes an ITO/glass substrate. FIG. 12 also illustrates schematic diagram of an SM-OLED device 245 during preparation. In FIG. 12, substrate 250 is in a vacuum chamber (e.g., vacuum chamber 256) with two source boats 255. According to on embodiment, the source boats 255 include N,N'-di-1-naphthyl-N,N'-diphenyl-1,1'-biphenyl-4,4'diamine ("NPD") and tris(8-hydroxyquinoline) aluminum(III) ("$Alq_3$") sources. Since both substrate 250 and source boats 255 are in a vacuum (e.g., vacuum chamber 256), small molecules 257 (shown in FIG. 12) are thermally evaporated from source boats 255 to strike and adhere to substrate 250. In addition, FIGS. 13A through 13C illustrates a schematic diagram of full color patterning of a simple SM-OLED device 245. As shown in FIGS. 13A through 13C, three successive emissions layers (e.g., 260, 261, and 262) are applied to substrate 250 and cathode separator 259 using shadow mask 258. According to one embodiment herein, substrate 250 includes an ITO substrate with the following emission layers applied thereto: a first emission layer 260 (e.g., a red emission layer), a second emission layer 261 (e.g., a green emission layer), and a third emission layer 262 (e.g., a blue emission layer).

FIG. 14, with reference to FIGS. 1 through 13C, illustrates a schematic diagram of a polymer LED (PLED) device 1350. As shown in FIG. 14, PLED device 1350 includes a substrate 1351, a first layer 1352, a second layer 1353, and a third layer 1354. In addition, the embodiment of PLED device 1350 shown in FIG. 14 includes a plurality of connections 1355 to external circuits. Moreover, according to one embodiment herein, substrate 1351 includes a glass substrate, first layer 1352 includes an ITO layer, and second layer 1353 includes a poly(p-phenylenevinylene) layer. In addition, according to one embodiment herein, third layer 1353 includes at least one of aluminum, magnesium, and calcium.

FIGS. 15A through 15D, with reference to FIGS. 1 through 14, illustrate schematic diagrams of fabricating a PLED device 1350. As shown in FIG. 15A, PLED device 1350 starts with a pre-clean ITO/glass substrate layer. In FIG. 15B, a PEDOT layer (e.g., a chemical diagram of PEDOT is shown in FIG. 16) is applied to PLED 1350 via spin coating and baking. In FIG. 15C, a MEH-PPV layer (e.g., a chemical diagram of MEH-PPV is shown in FIG. 17) is applied to PLED 1350 via spin coating and baking. FIG. 15D illustrates PLED 1350 after a cathode deposition. In addition to the depositions methods described above, alternative methods of deposition may be used, such as inkjet printing, screen-printing, and a roll-to-roll process.

Table 1, shown below, illustrates the performance differences of the devices discussed above (e.g., SM-OLED 250 vs. PLED 1350) along different metrics.

TABLE 1

| Color | Polymers | | Small Molecules | |
|---|---|---|---|---|
| | Efficiency (cd/A) | Half-Life (hrs) @ 150 nits, RT | Efficiency (cd/A) | Half-Life (hrs) @ 150 nits, RT |
| Red | 1-2 | >20,000 | 4-5 | >40,000 |
| Green | 8-10 | 15,000 | 8-9 | >40,000 |
| Blue | 4 | 3,000 | 3 | 10,000 |
| Yellow | 8-10 | >30,000 | 8 | >30,000 |
| White | 2-4 | 5,000 | 6-8 | 20,000 |

As discussed in further detail below, the embodiments herein support and enable efficient combinatorial processing. For example, in an embodiment described below, combinatorial processing provides rapid evaluation of OLED processing operations. Some exemplary OLED processing operations include operations for adding (depositions) layers (e.g., packaging layer 10, cathode layer 15, ET layer 20, emission layer 25, HT layer 30, and anode layer 35 on substrate 40, as shown in FIG. 5), defining features, preparing layers (e.g., cleans), doping, etc. In such embodiments, the systems supporting the combinatorial processing are flexible to accommodate the demands for running the different processes either in parallel, serial, or some combination of the two.

The materials used for each layer described above, (i.e., packaging layer 10, cathode layer 15, ET layer 20, emission layer 25, HT layer 30, anode layer 35, and substrate 40 as shown in FIG. 5) undergo considerable R&D. For example, a DOE matrix 1000 (e.g., as shown in FIG. 1) may be built that layers different combinations of possible materials to determine optimal performance. Such an example DOE matrix 1000 (e.g., as shown in FIG. 1) may include different substrate materials for substrate 40, such as glass (e.g., float, soda lime, window, etc.), metal foils (e.g., stainless steel, aluminum, etc.), and plastic (polyethylene, polyimide, etc.), combined with different layer materials, such as anode layer 35 (ITO, Al-doped ZnO (AZO), $Zn_2SnO_4$ (ZTO), etc.) and/or cathode layer 15 (e.g., Ba, Ca, Mg, Al, etc.). In addition, each combination may be subjected to different process conditions, such as a process tool (e.g., RF, DC, Pulsed DC, ALD, PEALD, etc.), doping parameters (e.g., concentration, doping location, etc.), unit process (e.g., gas flows, power density, substrate temperature, precursor temperature, oxidant, etc.), and thermal treatments (e.g., temperature, time, etc.).

Figure 19:
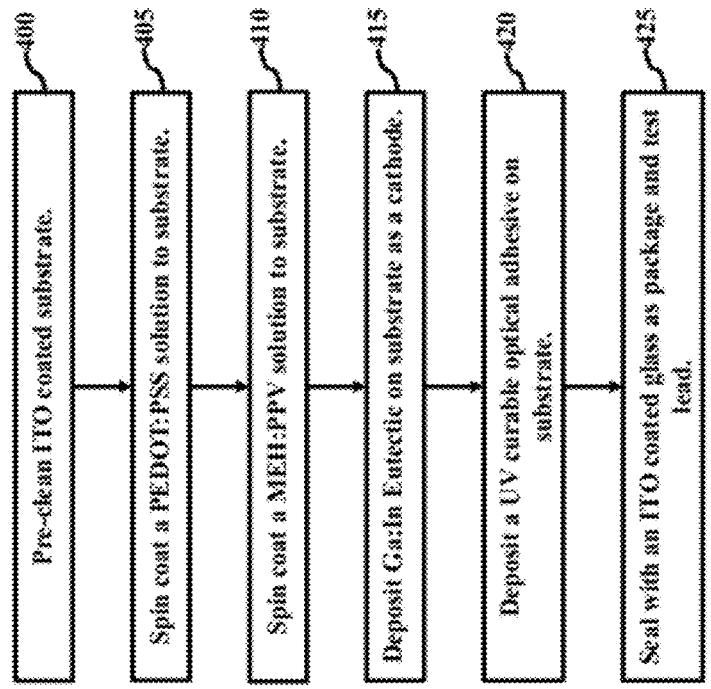
FIG. 19 illustrates a fabrication flow of an OLED device according to an embodiment herein.
Figure 18A:
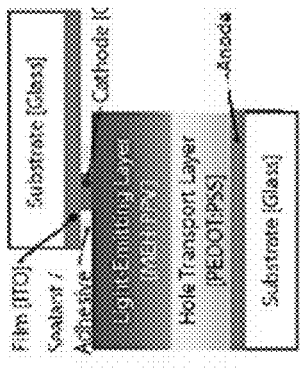
FIGS. 18A and 18B illustrate a schematic diagram of an example OLED device according to an embodiment herein.
Figure 18B:
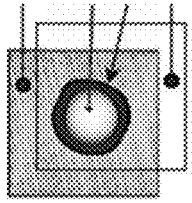
Figure 20:
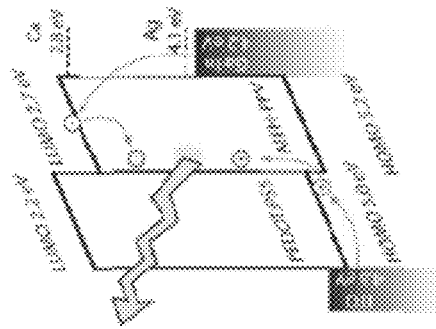
FIG. 20 illustrates an energy diagram of an OLED device according to an embodiment herein.

According to one embodiment herein, the prototypes shown in FIGS. 18A and 18B are fabricated according to the fabrication flow shown in FIG. 19, with reference to FIGS. 1 through 18B. In the method shown in FIG. 19, an ITO-coated glass substrate is pre-cleaned in step 400. In step 405, poly (3,4-ethylenedioxythiophene) poly(styrenesulfonate) ("PEDOT:PSS") is applied via spin coating (e.g., for 300 seconds at a speed of 1,000 RPM). In step 410, poly[2-methoxy, 5-(2-ethylhexoxy)-1,4-phenylene vinylene] ("MEH:PPV" and shown in the chemical diagram of FIGS. 16 and 17) solution is applied via spin coating (e.g., 4.5 mg/mL of MEH:PPV in m-Xylene and applied for 10 seconds at a speed of 550 RPM, then for 30 seconds at a speed of 2,000 RPM). In step 415, a Ga:In Eutectic is deposited as a cathode, and in step 420, and an UV curable optical adhesive is deposited. Next, in step 425, an ITO-coated glass is used as a package layer and test lead.

For example, according to one embodiment herein, MEH:PPV is used as an emission layer (e.g., emission layer 25, shown in FIG. 5) and PEDOT:PSS is used as a hole transport Layer (e.g., HT Layer 30, shown in FIG. 5). In such a configuration, the energy difference between the HOMO energy of PEDOT:PSS and the LUMO energy of MEH:PPV is ~2.3 eV, as shown in this equation:

$$\frac{hc}{\lambda_{photon}} = 2.3 \text{ eV} = 3.9 \times 10^{-19} \text{ J} \Rightarrow \lambda_{photon} = \frac{1.24 \text{ eV} - \mu m}{2.3 \text{ eV}} = 540 \text{ nm}$$

Figure 21:
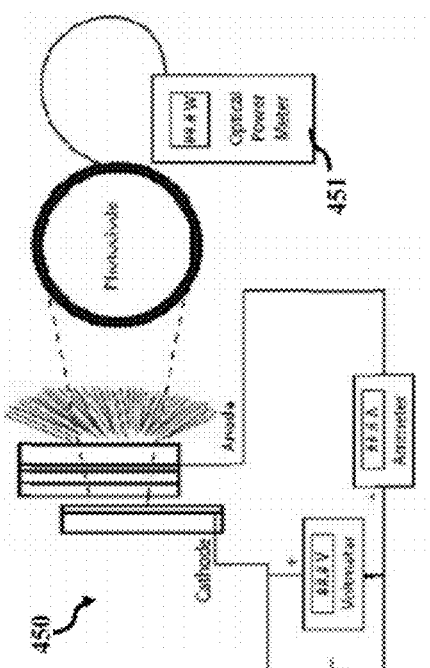
FIG. 21 illustrates an electro-luminance diagram of an OLED device according to an embodiment herein.

FIG. 21, with reference to FIGS. 1 through 20, illustrates the peak electro-luminance of such a configuration occurs at 540 nm (i.e., a yellow-orange color), where 580 nm may be observed when accounting for other key factors—such as trap levels.

As described above, according to one embodiment herein, the fabrication flow of the prototypes shown in FIGS. 18A and 18B begin with the preparation of an ITO layer (e.g., step 400). During the preparation of the ITO layer, the ITO surface is pre-cleaned prior to emitter deposition (e.g., emission layer 25). For example, according to one embodiment herein, the ITO pre-clean processes includes the following steps: provide a 1 square-inch ITO-coated glass wafer; determine the ITO side by an ohm meter and mark it (the ITO resistance should be below 1K ohm); wipe the ITO surface using lens paper with clean acetone (one side, one time); put the glass wafer into a container covered with a watch glass; fill container with approximately ½ deionized (DI) water and Alconox® glass detergent (available from Alconox, N.Y., USA); sonicate for approximately 10 minutes; drain soapy water; rinse with DI water; refill the container with plain DI water; sonicate for approximately 10 minutes; rinse again with DI water and fill container with approximately ½ inch of acetone; sonicate for approximately 5 minutes; rinse again with DI water and fill container with approximately ½ inch alcohol (ethanol or isopropanol); sonicate for approximately 5 minutes; drain alcohol; and place glass wafer into a preheated vacuum oven at approximately 120° C. for approximately 10 minutes.

According to another embodiment, the ITO pre-clean preparation (e.g., step 400) includes the following steps:

clean a substrate (e.g., substrate 40) with a lint free tissue and aceton to remove adhering particles; immerse in a glass detergent solution (e.g., 3% Mucasol, Kalle, Germany) with DI water and sonicate at approximately 60° C. for approximately 10 minutes; rinse with DI water and sonicate cleaning in DI water for approximately 10 minutes at approximately 60° C.; rinse with DI water and sonicate cleaning in ethanol for approximately 5 minutes; rinse with DI water and sonicate cleaning in aceton for approximately 5 minutes at approximately 40° C.; and repeat the above cleaning at least once. According to yet another embodiment, the ITO pre-clean preparation (e.g., step 400) includes: clean a substrate (e.g., substrate 40) with an air gun and methanol; and place on a hot plate set at approximately 140° C. to dry.

According to one embodiment herein, application of a PEDOT:PSS layer (e.g., as shown in step 405) is used as a hole transport/electron block layer (e.g., HT layer 30)—where the PEDOT:PSS is a doped organic semiconductor polymer that acts as a metal and is a good conductor of holes, but is a poor conductor of electrons. According to one embodiment herein, application of a PEDOT:PSS layer (405) includes: filling a lcc syringe with approximately ½ ml of a PEDOT:PSS aqueous solution and attaching a 0.2 μm or 0.45 syringe filter to the end; turning on nitrogen, set spin coater speed=1000 RPM, time=300 sec; carefully pushing solution covering the center of wafer (at least area inside o-ring); closing the lid and turning on the spinner; placing the finished wafer into a vacuum oven at approximately 100° C. or above, and baking for approximately 20 minutes or more. According to another embodiment herein, application of a PEDOT:PSS layer (405) includes: placing approximately 10-15 drops of solution into substrate using a syringe and 0.45 μm filter; securing the substrate in spin coater, speed=2000 rpm, time=30 sec, acceleration=1870 rpm/sec; putting finished wafer to a hotplate at approximately 140° C. dry for approximately 15 minutes.

According to one embodiment herein, application of a MEH:PPV layer (e.g., as shown in step 410) is used as an emission layer (e.g., emission layer 25). According to one embodiment herein, application of an MEH:PPV layer (410) includes: putting a wafer on a spinner; placing approximately 10-15 drops of an MEH:PPV solution onto wafer using syringe and 0.45 μm filter; starting the spin, where stage 1 includes approximately 550 rpm, for approximately 10 seconds at approximately 595 rpm/sec acceleration and stage 2 includes approximately 2000 rpm for approximately 30 seconds at approximately 4080 rpm/sec acceleration; placing wafer on hot plate at approximately 140° C. and dry for approximately 10 minutes. According to one embodiment herein, preparation of an MEH:PPV solution includes: cleaning one 20 mL vial and add 81 mg MEH:PPV plus 18 mL m-Xylene; securing the cap to the vial and wrapping the seam with vinyl tape (e.g., electrical tape); sonicate the vial for approximately 120 minutes or until well-mixed, being careful not to over-mix the solution. The total prepared solution, according to the above embodiment, is approximately 18 mL.

Alternatively, according to one embodiment herein, PDHF is used as a blue emission layer (e.g., emission layer 25). According to one embodiment herein, application of the blue emission layer (e.g., emission layer 25) includes: making a polymer solution (e.g., 10 mg/mL in toluene, using 1.5 mL; heating and stifling the polymer solution on a hot plane with low temperature for an hour; cooling the polymer solution to room temperature before spinning); spinning the emission layer (e.g., put 300 μL onto the center of the substrate using the auto-pipet; closing the lid and starting the spin, where speed=2000 rpm and time=300 seconds); putting the substrate in a vacuum oven 100° C. or above for 10 minutes to remove any possible toluene; and rubbing polymer off using cotton swab and chloroform at corner of ITO to expose test contact.

According to one embodiment herein, application of Ga:In Eutectic (e.g., as shown in step 415) is used as a cathode (e.g., cathode layer 15) and seal (e.g., packaging layer 10). According to one embodiment herein, application of a Ga:In Eutectic (415) includes creating a cathode (e.g., cathode layer 15) with Ga:In Eutectic, optical adhesive, and an ITO coated glass and adhering the cathode substrate (e.g., step 420) to an anode substrate with prepared polymer layers. According to one embodiment, creating the cathode (e.g., cathode layer 15) includes: applying a small quantity of Ga:In Eutectic near the corner of cathode substrate using a cotton swab applicator; and loosely encircling the Ga:In spot using the syringe filled with optical adhesive. Additionally, according to one embodiment herein, adhering the cathode substrate includes: placing an anode substrate on a table; inverting the cathode substrate and gently place it onto the anode substrate with enough offset to attach test clips; applying gentle pressure with a cotton swab applicator to spread the Ga:In Eutectic; and curing the optical adhesive for approximately 1 minute using a UV light (e.g., step 425).

Alternatively, according to one embodiment herein, an Indium foil+melt is used as a cathode (e.g., cathode layer 25). According to one embodiment herein, application of an Indium foil+melt cathode includes: cutting approximately 7-10 small (approximately 3 mm square) pieces of Indium foil; carefully arranging the foils onto the substrate and spacing them; once the foil covers the area where polymers were rubbed off (as the anode); polymer films are fragile so that not moving foils around much; heating the foil at approximately 150° C. to melt the Indium.

Figure 22:
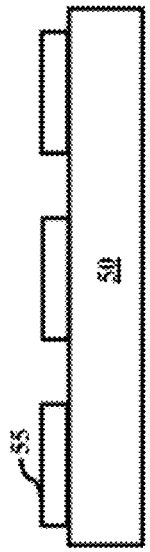
FIG. 22 illustrates a schematic diagram of an example OLED test device according to an embodiment herein.

Thus, as shown in FIG. 22, a simple stand-alone testing setup 450 can be used with an optical power meter 451. Additionally, the embodiments herein can be integrated into quantum efficiency (QE) tool (not shown) for test automation, while, according to one embodiment herein, an initial workflow buildup phase (as described below) can be use a simple visual check to determine whether a light is being emitted.

Figure 23A:
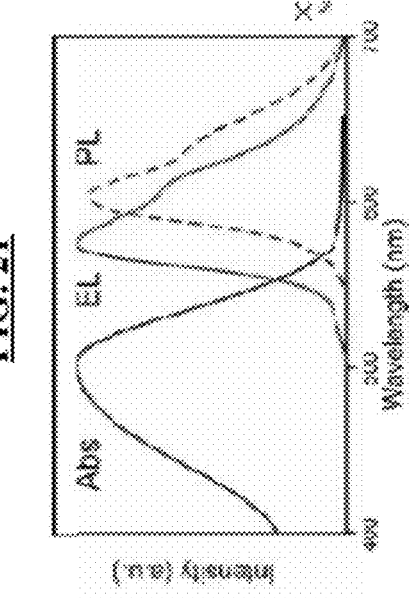
FIG. 23A illustrates a top down view of a substrate used to form test structures and process conditions according to an embodiment herein.
Figure 23B:
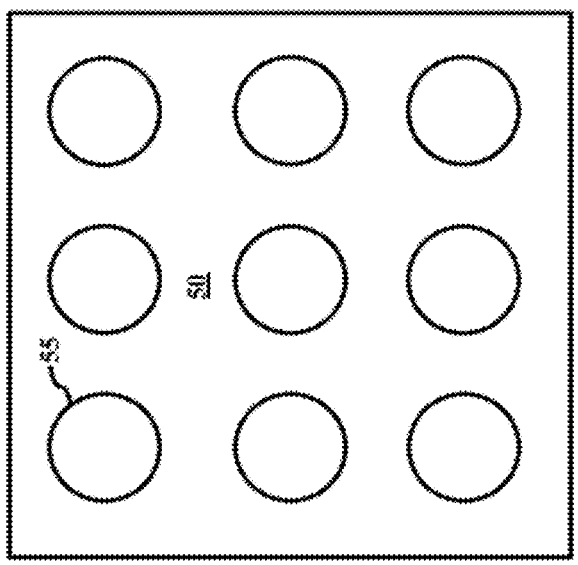
FIG. 23B illustrates a cross-sectional view of the substrate shown in FIG. 23A according to an embodiment herein.

FIG. 23A, with reference to FIGS. 1 through 22, illustrates a substrate 50 with multiple process conditions deposited thereon, according to an embodiment herein. Additionally, FIG. 23B, with reference to FIGS. 1 through 23A, illustrates a cross-sectional view of FIG. 23A. As shown in FIGS. 23A and 23B, substrate 50 has deposited thereon a plurality of process conditions 55. According to one embodiment herein, process conditions 55 include the layers shown in FIG. 5 or a portion thereof. As described in further detail below, the combinatorial processing according to an embodiment herein may include any processing (e.g., OLED processing) that varies the processing conditions of different layers (e.g., as shown in FIG. 5) in two or more regions of a substrate 50. A substrate 50 may be, for example, a polyethylene substrate used in OLED processing.

FIG. 24A, with reference to FIGS. 1 through 23B, illustrates a substrate 50 with multiple process conditions deposited thereon, according to an embodiment herein. Additionally, FIG. 24B, with reference to FIGS. 1 through 24A, illustrates a cross-sectional view of FIG. 24A. As shown in FIGS. 24A and 24B, substrate 50 and process conditions 55 have deposited thereon a blanket emission/transport organic polymer layer 53 (e.g., emission layer 25). According to one embodiment herein, a spinner deposits layer 53, where the blanket layer 53 is mechanically inscribed to isolate each process conditions 55.

FIG. 25A, with reference to FIGS. 1 through 24B, illustrates a substrate 50 with multiple process conditions deposited thereon, according to an embodiment herein. Additionally, FIG. 25B, with reference to FIGS. 1 through 25A, illustrates a cross-sectional view of FIG. 25A. As shown in FIGS. 25A and 25B, process conditions 55 (e.g., an anode material) are deposited on substrate 50 (e.g., glass, PET, etc.), and atop process conditions 55 is another process condition 60 (e.g., a cathode material) that physically occupied different dimensions that process condition 55 (e.g., process condition 60 occupies a smaller area compared to process condition 55). Thus, as shown in FIGS. 25A and 25B, a different site isolated cathode can be deposited atop each process condition 55. Thereafter, according to one embodiment herein, the process conditions (e.g., process condition 55 and process condition 60) are tested with a probe (not shown) punching through the soft organic layers (e.g., process condition 55 and process condition 60).

As shown in FIGS. 23A through 25B, a region (e.g., process condition 55) of a substrate (e.g., substrate 50) may be any portion of the substrate 50 that is somehow defined, for example by dividing the substrate 50 into regions having predetermined dimensions or by using physical barriers, such as sleeves, over the substrate 50. In addition, since a region (e.g., process conditions 55) on the substrate 50 may include wet pools of deposited sample material. For example, according to one embodiment herein, one-inch circles of different anode material (e.g., process conditions 55) are deposited on substrate 50 (e.g., glass, Polyethylene terephthalate or simply PET). In addition, a region (e.g., process conditions 55) may or may not be isolated from other regions. For example, a substrate 50 may be divided into two or more regions, each of which may or may not include OLED device structures (e.g., one or more of packaging layer 10, cathode layer 15, ET layer 20, emission layer 25, HT layer 30, and anode layer 35, as shown in FIG. 5).

It should further be appreciated that a region (e.g., process conditions 55) may be adjacent to another region in one embodiment or the regions may be isolated and, therefore, non-overlapping. When the regions are adjacent, there may be a slight overlap wherein the materials or precise process interactions are unknown, however, a portion of the regions, normally at least 60% or more of the area, is uniform and all testing occurs within that region. Furthermore, the potential overlap is only allowed with materials of processes that will not adversely affect the result of the tests. Both types of regions are referred to herein as regions or discrete regions.

Figure 26:
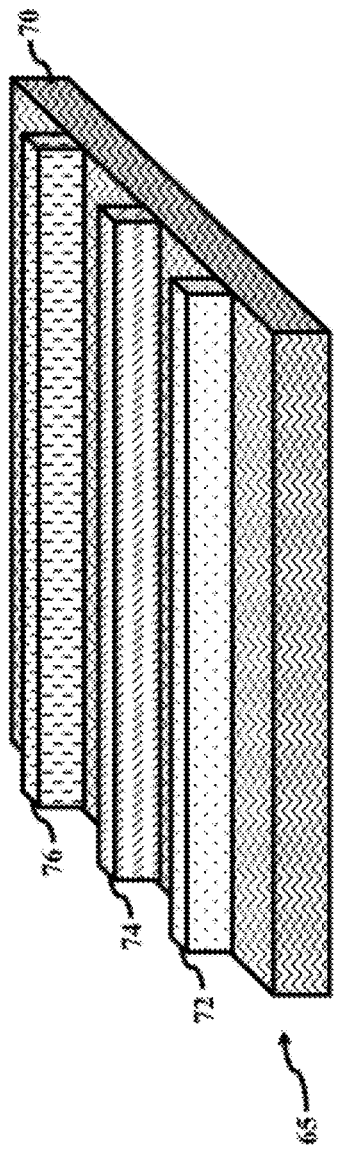
FIG. 26 illustrates a perspective view of a substrate used to form test structures and process conditions according to an embodiment herein.
Figure 27:
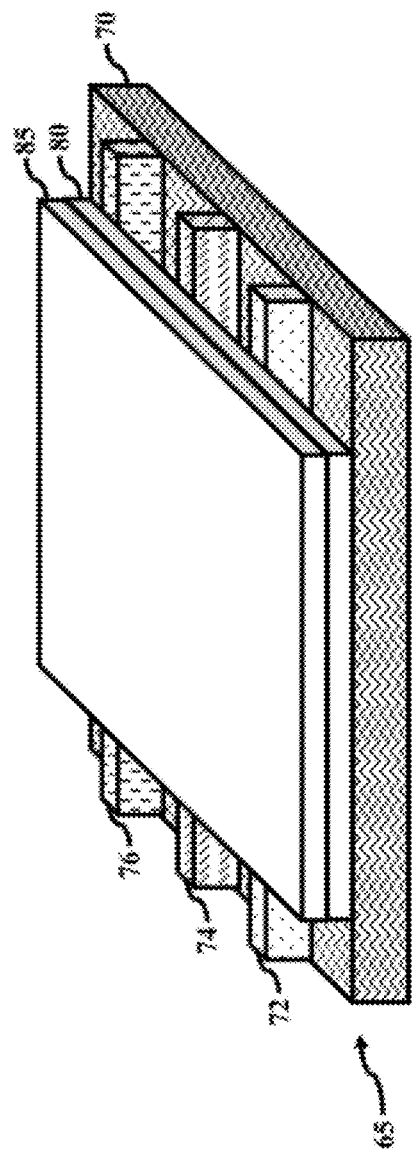
FIG. 27 illustrates another perspective view of a substrate used to form test structures and process conditions according to an embodiment herein.
Figure 28:
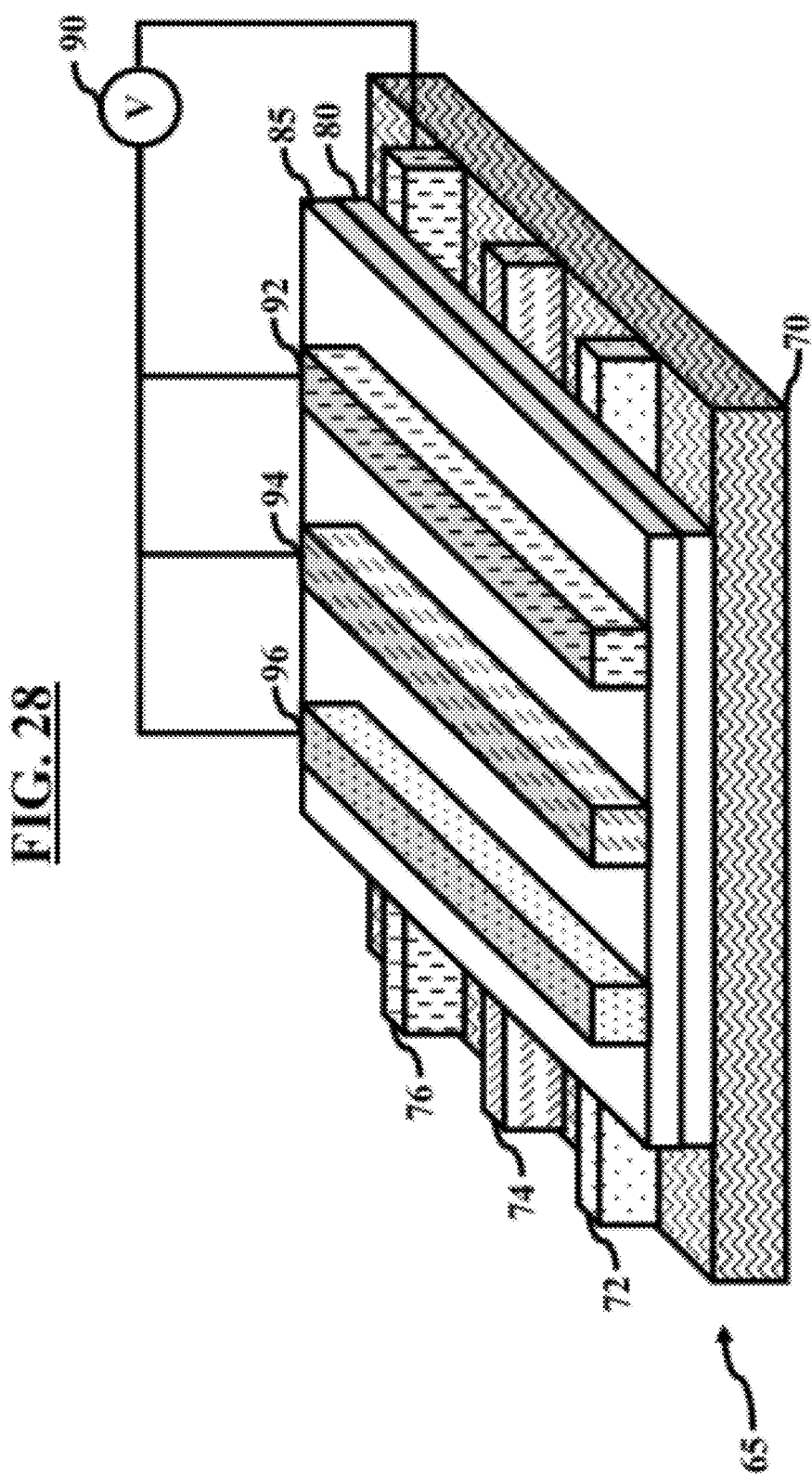
FIG. 28 illustrates a perspective view of a substrate and testing apparatus used to form additional test structures and process conditions according to an embodiment herein.

As an example, FIGS. 26 through 28, with reference to FIGS. 1 through 25B, illustrate schematic diagrams of various process conditions being applied to a substrate 70 according to an embodiment herein. According to the embodiment shown in FIG. 26, combinatorial test substrate 65 includes glass substrate 70 with a first transparent conducting oxide (TCO) 72, a second TCO 74, and a third TCO 76 deposited thereon. Furthermore, according to one embodiment herein, TCO 72, 74, and 76 each include various combinatorial combinations according to a DOE matrix (e.g., DOE matrix 1000 of FIG. 1). For example, TCO 72, 74, and 76 may each be an anode that includes a ZnO derived compound, which has been subjected to different doping materials, concentrations of doping material, etc. Therefore, according to one embodiment herein, each TCO 72, 74, and 76 includes a different material and/or composition according to a DOE matrix (e.g., DOE matrix 1000 of FIG. 1).

According to the embodiment shown in FIG. 27, combinatorial test substrate 65 further includes first polymer layer 80 and second polymer layer 85. For example, according to the embodiment shown in FIG. 27, first polymer layer 80 includes emission layer 25 (shown in FIG. 5) and second polymer layer 85 includes HT layer 30 (shown in FIG. 5). As described above, first polymer layer 80 and second polymer layer 85 may each include various combinatorial combinations according to a DOE matrix (e.g., DOE matrix 1000 of FIG. 1). Moreover, according to one embodiment herein, first polymer layer 80 is a combination of an ET layer 20 (shown in FIG. 5) and an emission layer 25 (shown in FIG. 5).

As shown according to the embodiment illustrated in FIG. 28, combinatorial test substrate 65 further includes a first cathode 92, a second cathode 94, and a third cathode 96. Furthermore, according to one embodiment herein, cathode 92, 94, and 96 each include various combinatorial combinations according to a DOE matrix (e.g., DOE matrix 1000 of FIG. 1). For example, cathode 92, 94, and 96 may each include a different material and/or composition according to a DOE matrix (e.g., DOE matrix 1000 of FIG. 1). Possible cathode materials include aluminum, magnesium, etc. or mixtures thereof.

Embodiments herein are not limited to one type of deposition technology. For example, according to one embodiment herein, FIGS. 26 and 28 include deposition by a physical vapor deposition (PVD) process and FIG. 27 includes deposition by a spinner (or using spin coating technology). In general, for example, embodiments herein support an arbitrary combination of dry processing tools (e.g., a PVD deposition process or an atomic layer deposition (ALD) deposition process) and wet processing tools. The operating conditions of these tools offer another dimension to a DOE matrix (e.g., DOE matrix 1000 of FIG. 1), according to one embodiment herein. Such operating conditions may include, for example, a stir rate, chemical composition of the material being deposited, dilution of the material being deposited, time, temperature (e.g., ambient temperature, deposition temperature), deposited film thickness, and deposition conditions (e.g., pressured during deposition, power applied during deposition, pre-cursor used, source material used, and gases used). In addition, to combine a wet processing tool with a dry processing tool, a template is used according to one embodiment that aligns the process conditions (e.g., process condition 55, shown in FIGS. 23A through 25B) in both the wet and dry processing tools.

FIG. 28 also includes a voltage source 90 being applied to TCO 76 and cathodes 92, 94, and 96. With the combination of first polymer 80 and second polymer 85, several different combinations of rudimentary OLED configurations (e.g., as shown in FIG. 5) may be simultaneously tested and compared. Such a technique is not possible in conventional processes given the testing parameters used in conventional solutions. Moreover, in one embodiment described herein, the combinatorial processing described above includes parametric testing (e.g., leakage, resistance, and capacitance tests) of material compositions (e.g., process conditions) on a single combinatorial test substrate 65 and is performed as a first stage of screening. Thereafter, the material compositions that do not meet a pre-determined set of requirements are filtered and removed from further consideration.

Figure 29:
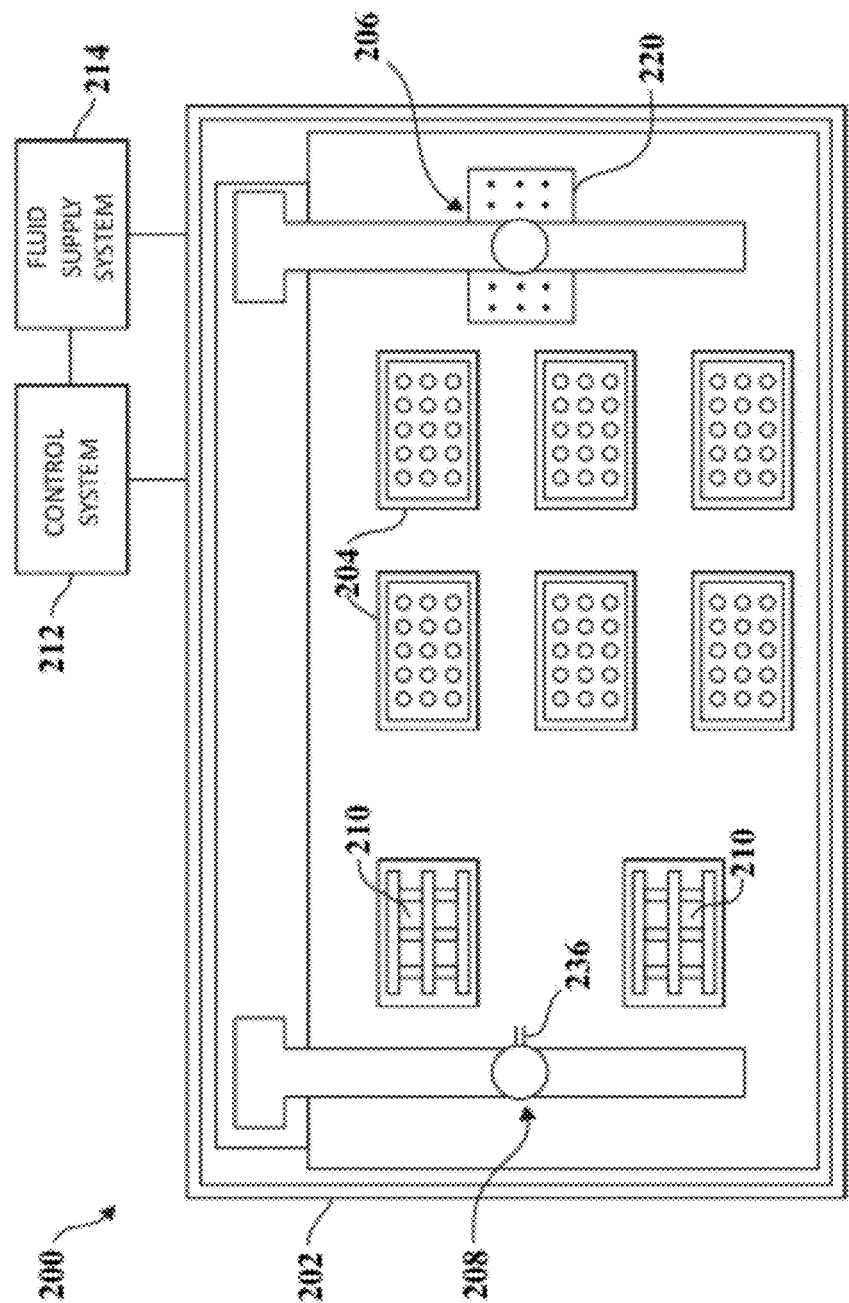
FIG. 29 illustrates a top view of a schematic diagram of a combinatorial dip-coating wet processing apparatus according to an embodiment herein.

As described above, embodiments herein include both wet and dry processing technologies. A wet processing tool, for example, is shown in FIG. 29, with reference to FIGS. 1 through 28. FIG. 29 illustrates a high performance combinatorial (HPC) dip-coating apparatus (or tool or system) 200 that may be used to process and screen many coatings in parallel during a primary screening. The dip-coating apparatus 200 includes a housing (and/or processing chamber) 202, well holders 204 coupled to (and within) the housing 202, a dispense arm (or dispense arm assembly) 206, and a dip-coating arm (or dip coating arm assembly) 208, substrate holders 210, a control system 212, and a fluid supply system 214.

The housing 202 may control the environment in which the processing occurs. In an embodiment where the dip-coated substrates are dried by exposure to air, the control of the environment within the housing 202 may be useful.

The fluid supply system 214 may include one or more supplies of the various processing fluids (i.e., liquids, gases, etc.) used in the methods and processes described herein. The control system 212 may include a processor and memory (i.e., computing system 500, shown in FIG. 38) in operable communication with the other components of the dip-coating tool 200 and be configured to control the operation thereof in accordance with the methods and processes described herein.

It should also be understood that although not shown as a separate component, the dip-coating tool 200 includes a variation generating system (or subsystem) capable of creating variations between at least two of the formulations, substrates, coatings, or portions of a single substrate, as described in greater detail below. These variations may relate to specifications such as temperatures, exposure times, layer thicknesses, chemical compositions, humidity, etc. of the formulations and/or the substrates at various stages of the screening processes described herein. It should be understood that these variations are intentionally created for the purposes of evaluating the characteristics of specific materials and processing techniques in order to identify those that are best suited for particular uses.

Figure 30:
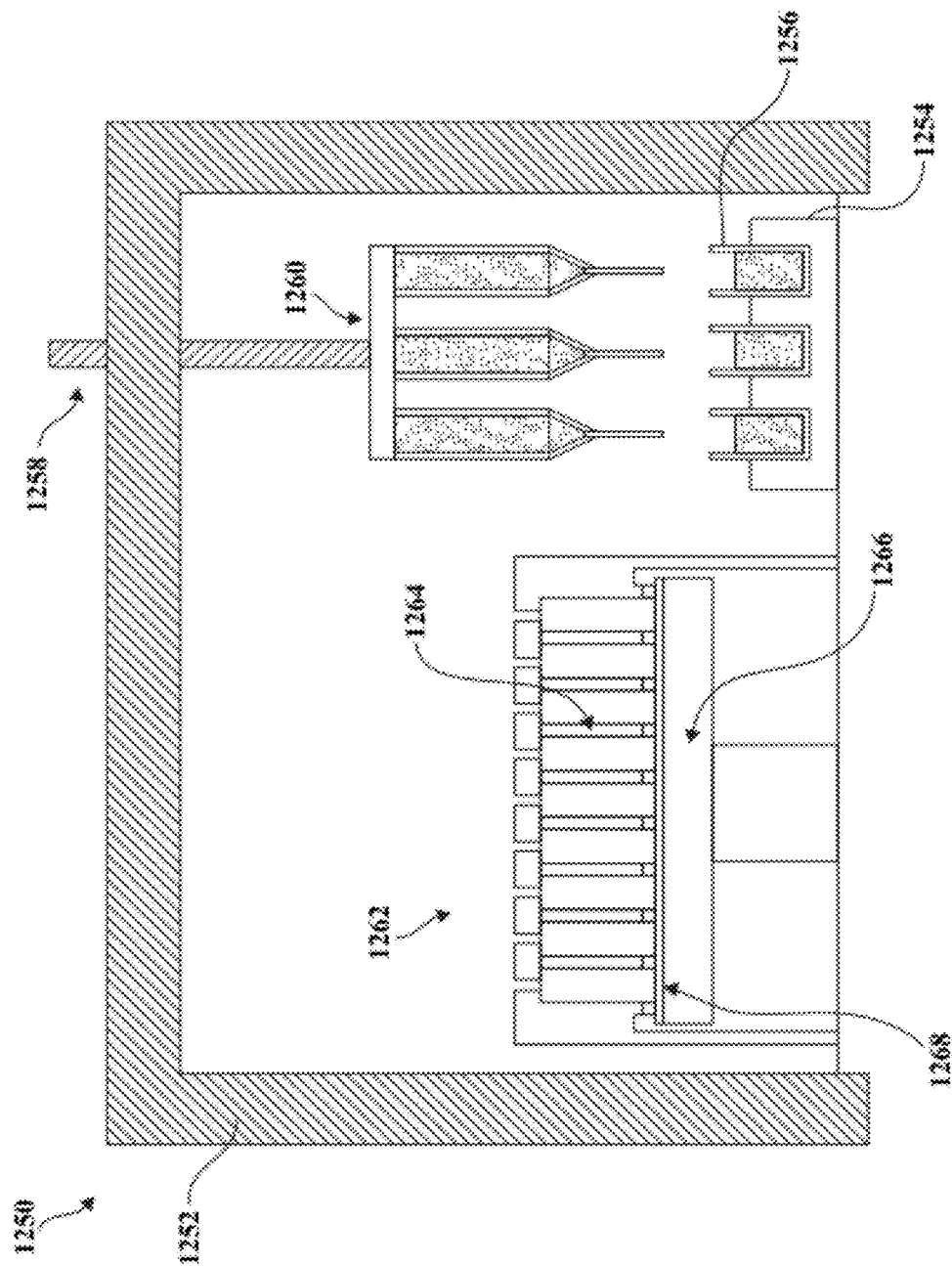
FIG. 30 illustrates a front view of a schematic diagram of combinatorial dip-coating wet processing apparatus according to an embodiment herein.

Alternatively, if a single substrate (e.g., substrate 50) is coated with the coating having known particle count, density, and distribution, a plurality of cleaning solutions may be applied to site-isolated regions of the substrate using the combinatorial wet processing tool 1250 illustrated in FIG. 30, with reference to FIGS. 1 through 29. The combinatorial wet processing tool 1250 includes a housing (and/or processing chamber) 1252, a well holder 1254 holding wells 1256, and a dispense arm 1258 having a dispense head 1260, similar to the dip-coating combinatorial apparatus 200 described above. The wet processing tool 1250 also includes a reactor assembly 1262 having an array or reactors (or fluid containers) 1264 positioned over a substrate support 1266. A substrate 1268 is placed on the substrate support 1266 and positioned relative to the reactors 1264 such that bottom edges of the reactors contact the substrate 1268 and form seals around the respective portions of the substrate 1268. In a manner similar to that described above, the dispense arm 1258 may retrieve cleaning solutions from the wells 1254 and dispense them into the reactors 1264. Because of the seals formed between the reactors 1264 and the substrate 1268, the cleaning solutions remain within the reactors 1264 and are isolated from the other cleaning solutions. The cleaning solutions may be varied by varying the chemical composition or temperature. The time of application of the cleaning solutions may also be varied. It should be understood that although the wet processing tool 1250 in FIG. 30 is shown as being separate, it may be integrated into the dip-coating apparatus shown in FIG. 29.

Figure 31:
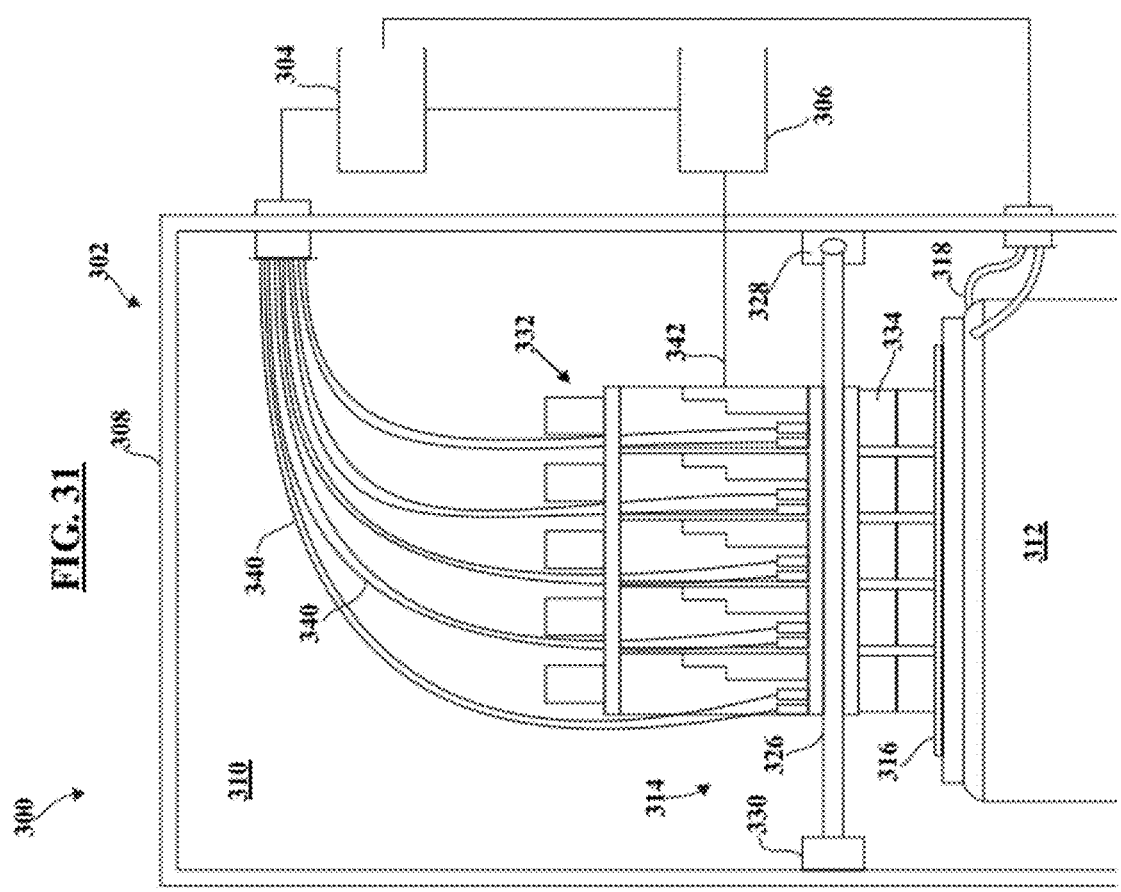
FIG. 31 illustrates a schematic diagram of a combinatorial wet processing apparatus according to an embodiment herein.
Figure 32:
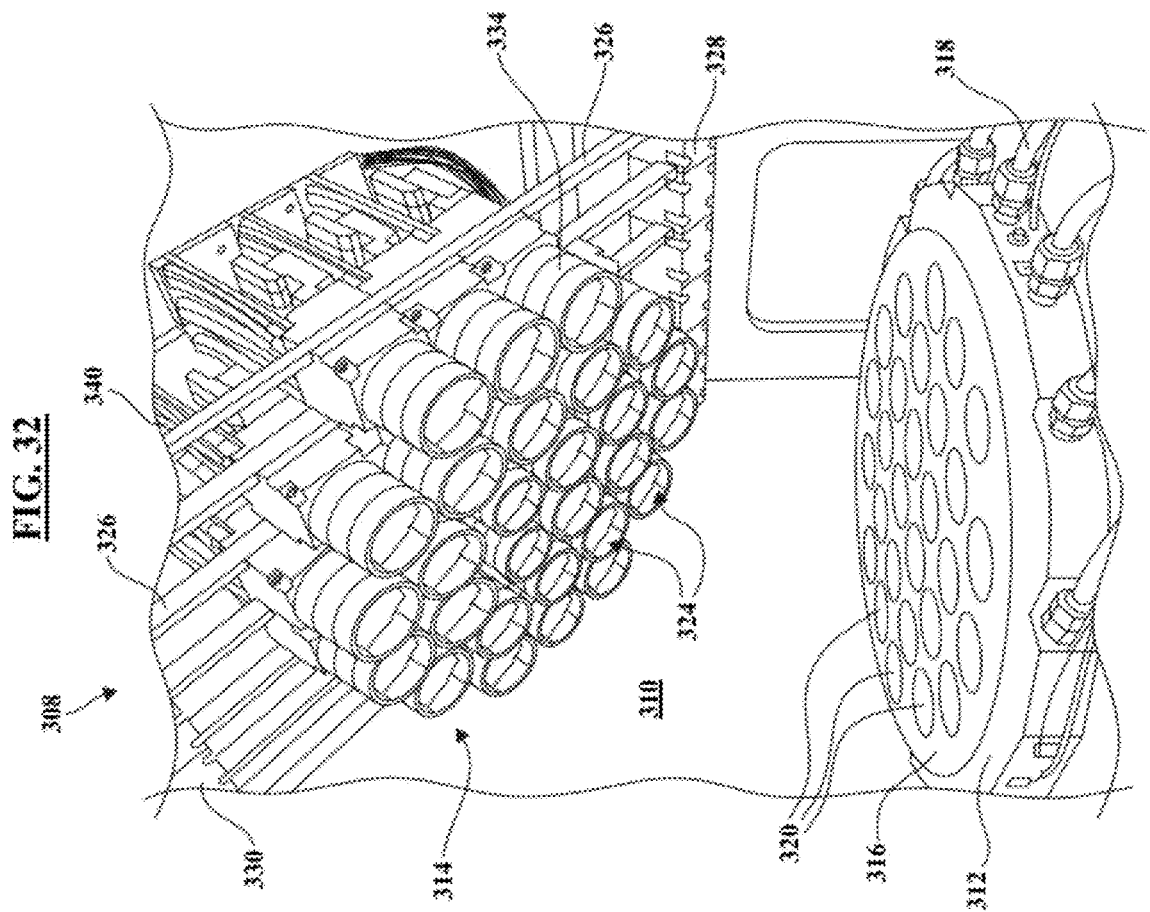
FIG. 32 illustrates a perspective view of a combinatorial wet processing apparatus according to an embodiment herein.
Figure 33:
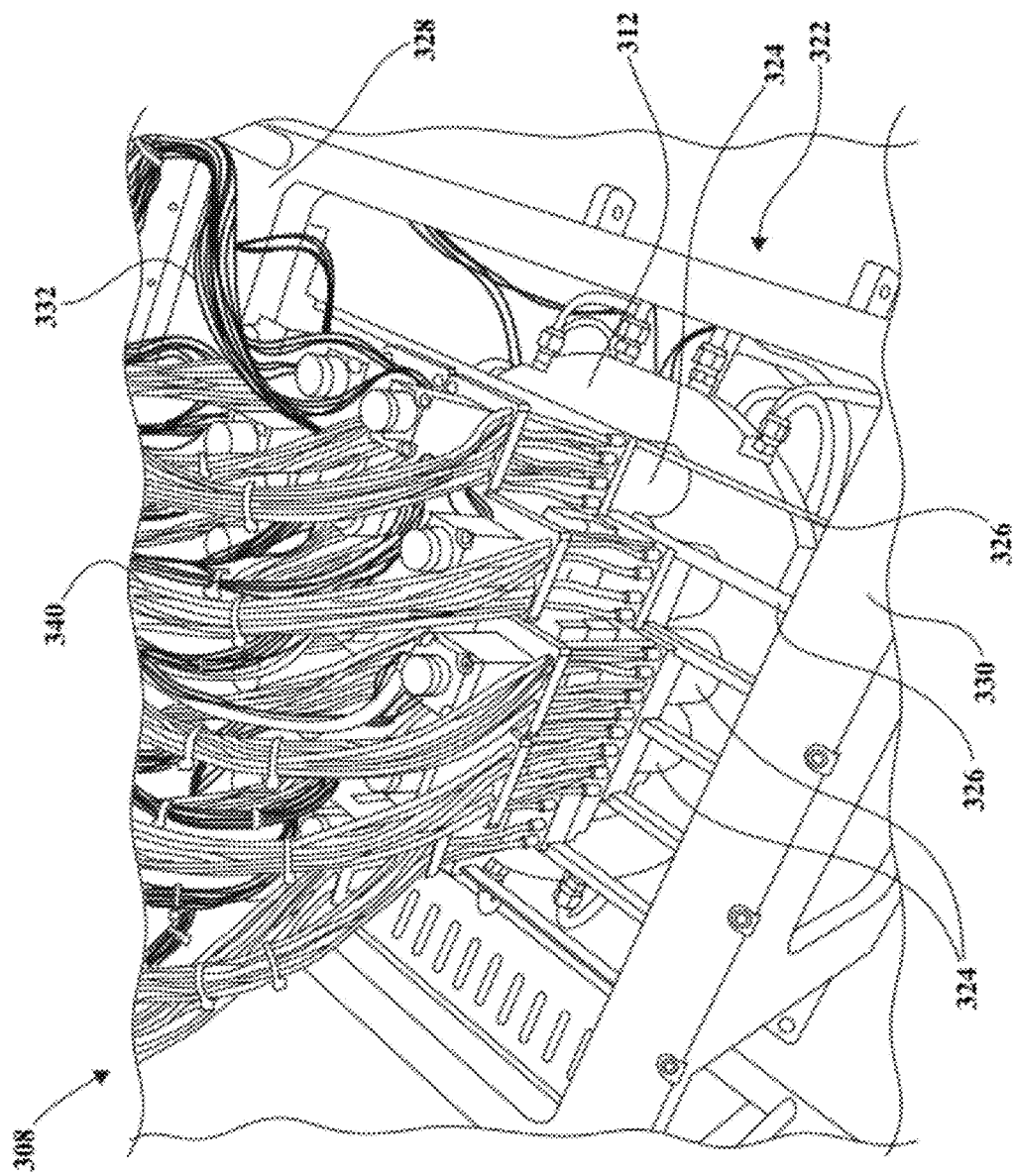
FIG. 33 illustrates another perspective view of a combinatorial wet processing apparatus according to an embodiment herein.

FIGS. 31 through 33, with reference to FIGS. 1 through 30, illustrates a wet (or megasonic) processing system 300, according to one embodiment herein. The wet processing system 300 includes a wet processing tool (and/or apparatus) 302, a processing fluid supply system 304, and a control system 306.

The wet processing tool 302 includes a housing 308 enclosing a processing chamber 310, a substrate support 312, and a wet processing assembly 314. The substrate support 312 is positioned within the processing chamber 310 and is configured to hold a substrate 316. Although not shown in detail, the substrate support 312 may be configured to secure the substrate using, for example, a vacuum chuck, electrostatic chuck, or other known mechanism. Additionally, the substrate support 312 may have a series of fluid passageways extending therethrough, which are in fluid communication with the processing fluid supply system 304 via support fluid lines 318.

The substrate 316 may be a conventional, round substrate (or wafer) having a diameter of, for example, 200 millimeter (mm) or 300 mm. In other embodiments, the substrate 316 may have other shapes, such as a square or rectangular. It should be understood that the substrate 316 may be a blanket substrate (i.e., having a substantial uniform surface), a coupon (e.g., partial wafer), or even a patterned substrate having predefined regions (or locations) 320. The wet processing assembly 314 includes a first scaffolding 322 and an array of wet processing units 324 attached to a second scaffolding 324. The first scaffolding 322 includes a plurality of scaffolding bars 326 extending between end pieces 328 and 330. As shown in FIG. 29, end piece 328 is pivotably (or rotatably) coupled to the housing 308.

The wet processing units 324 are arranged in a series of rows (or sticks) 332, with each of the rows 332 being positioned between adjacent scaffolding bars 326. Moreover, the number of wet processing units 324 in each row 332 may differ, as is appropriate given the size and shape of the substrate 316. Each of the wet processing units 324 includes, amongst other components, a liquid container (or reactor) 334, a transducer actuator (not shown) housed above the liquid container 334, and a transducer (i.e., megasonic transducer) 338 positioned within the liquid container (not shown) and coupled to the transducer actuator.

Each of the liquid containers 334 is in fluid communication with the processing fluid supply system 304 via a series of fluid lines 340. Further, each of the wet processing units 324 (and/or the transducer actuators 336) is in operable communication with the control system 306 via wiring 342.

The processing fluid supply system 304 includes one or more supplies of various processing fluids, such as cleaning solutions, as well as temperature control units to regulate the temperatures of the various fluids. The control system 306 includes, for example, a processor and memory (i.e., computing system 500, shown in FIG. 38) in operable communication with the processing fluid supply system 304 and the wet processing units 324 and is configured to control the operation thereof as described below.

After the substrate 316 is positioned on the substrate support 312 (i.e., by a robot which is not shown), the wet processing assembly 314 is lowered (or pivoted downwards) such that the liquid containers 334 of the wet processing units 324 contact the substrate 316 (or a surface thereof).

In addition, FIG. 34, with reference to FIGS. 1 through 33, illustrates a simplified schematic diagram of a dry combinatorial processing chamber configured to combinatorially process a substrate disposed therein in accordance with one embodiment herein. Processing chamber 350 includes a bottom chamber portion 352 disposed under top chamber portion 366. Within bottom portion 352 substrate support 356 is configured to hold a substrate 358 disposed thereon and can be any known substrate support, including but not limited to a vacuum chuck, electrostatic chuck or other known mechanisms. Substrate support 356 is capable of rotating around a central axis of the substrate support. In one embodiment, substrate support 356 rotates approximately 185 degrees to provide full access to the surface of a substrate. In another embodiment substrate support 356 rotates 360 degrees. In addition, substrate support 356 may move in a vertical direction or in a planar direction. It should be appreciated that the rotation and movement in the vertical direction or planar direction may be achieved through known drive mechanisms which include magnetic drives, linear drives, worm screws, lead screws, a differentially pumped rotary feed through drive, etc.

Substrate 358 may be a conventional round 200-millimeter, 300-millimeter or any other larger or smaller substrate/wafer size. In other embodiments, substrate 358 may be a square, rectangular, or other shaped substrate. One skilled in the art will appreciate that substrate 358 may be a blanket substrate, a coupon (e.g., partial wafer), or even a patterned substrate having predefined regions. In another embodiment, substrate 358 may have regions defined through the processing described herein. The term region is used herein to refer to a localized area on a substrate, which is, was, or is intended to be used for processing or formation of a selected material. The region can include one region and/or a series of regular or periodic regions pre-formed on the substrate. The region may have any convenient shape, e.g., circular, rectangular, elliptical, wedge-shaped, etc. In the semiconductor field a region may be, for example, a test structure, single die, multiple die, portion of a die, other defined portion of substrate, or a undefined area of a, e.g., blanket substrate which is defined through the processing.

Top chamber portion 366 of chamber 350 in FIG. 34 includes process kit shield 360, which defines a confinement region over a radial portion of substrate 358. Process kit shield 360 is in essence a sleeve having a base (optionally integral with the shield) and an optional top within chamber 350 that may be used to confine plasma generated therein. The generated plasma will dislodge particles from a target to process (e.g., be deposited) on an exposed surface of substrate 358 to combinatorially process regions of the substrate in one embodiment. Process kit shield 360 is capable of being moved in and out of chamber 350, i.e., the process kit shield is a replaceable insert. Process kit shield 360 includes an optional top portion, sidewalls, and a base. In one embodiment, process kit shield 360 is configured in a cylindrical shape; however, the process kit shield may be any suitable shape and is not limited to a cylindrical shape.

The base of process kit shield 360 includes an aperture 362 through which a surface of substrate 358 exposed for deposition or some other suitable semiconductor processing operation. Within top portion 366 is cover plate 368, which is moveably disposed over the base of process kit shield 360. Cover plate 368 may slide across a bottom surface of the base of process kit shield 360 in order to cover or expose aperture 362 in one embodiment. In another embodiment, cover plate 368 is controlled through an arm extension, which moves the cover plate to expose or cover aperture 362 as will be described in more detail below. It should be noted that although a single aperture is illustrated, multiple apertures may be included. Each aperture may be associated with a dedicated cover plate or a cover plate can be configured to cover more than one aperture simultaneously or separately. Alternatively, aperture 362 may be a larger opening and plate 368 may extend with that opening to either completely cover it or place one or more fixed apertures within that opening for processing the defined regions.

The optional top plate of process kit shield 360 of FIG. 34 may function as a datum shield as will be described further below. Process heads 364 (also referred to as deposition guns) are disposed within slots defined within the datum shield in accordance with one embodiment herein. Where a datum shield is utilized in the chamber, a datum shield slide cover plate 370 may be included. Datum shield slide cover plate 370 functions to seal off a deposition gun when the deposition gun may not be used for the processing. For example, two deposition guns 364 are illustrated in FIG. 34. Process heads 364 are moveable in a vertical direction so that one or both of the guns may be lifted from the slots of the datum shield. While two process heads are illustrated, any number of process heads may be included, e.g., three or four process heads may be included. Where more than one process head is included, the plurality of process heads may be referred to as a cluster of process heads. For example, while not shown in FIG. 34, the cluster of process heads may be rotatable around an axis. Slide cover plate 370 can be transitioned to isolate the lifted process heads from the processing area defined within process kit shield 360. In this manner, the process heads are isolated from certain processes when desired. It should be noted that while one slide cover plate 370 is illustrated, multiple slide cover plates may be included so that each slot or opening of the datum shield is associated with a cover plate. Alternatively, slide cover plate 370 may be integrated with the top of the process kit shield 360 to cover the opening as the process head is lifted or individual covers can be used for each target.

Top section 366 of chamber 350 of FIG. 34 includes sidewalls and a top plate which house process kit shield 360. Arm extensions 364a, which are fixed to process heads 364 extend through the region defined within top portion 366. Arm extensions 364a may be attached to a suitable drive, e.g., lead screw, worm gear, etc., configured to vertically move process heads 364 toward a top plate of top portion 366. Arm extensions 364a may be pivotably affixed to process heads 364 to enable the process heads to tilt relative to a vertical axis. In one embodiment, process heads 364 tilt toward aperture 362. In another embodiment, arm extensions 364a are attached to a bellows that allows for the vertical movement and tilting of process heads 364. Where a datum shield is utilized, the opening are configured to accommodate the tilting of the process heads. In one embodiment, the process heads are tilted by ten degrees or less relative to the vertical axis. It should be appreciated that the tilting of the process head enables tuning so that the gun may be tilted toward an aperture in the base plate to further enhance uniformity of a layer of material deposited through the aperture.

As illustrated in FIG. 34, process kit shield 360 is moveable in a vertical direction and is configured to rotate around an axis of the process kit shield. It should be appreciated that the axis 361 around which process kit shield 360 rotates is offset from both the axis around which substrate support 356 rotates and an axis 359 of a cluster of process heads in one embodiment. As process kit shield 360 rotates the relative position of the process heads 364 and the aperture 362 remains the same, thus the processing of the region on substrate 358 will be more uniform from site to site and not contain variability due to process head angle or relative positioning. While process heads 364 are described as clustered on the same axis as aperture 362, additional heads may be offset from the cluster of heads for doping, implantation or deposition of small amounts of a material, e.g., 1-10% without limitation. An alternative embodiment to provide access to regions on the entire substrate may include linear movement of upper chamber 366 as opposed to movement in an arc as shown in FIG. 34.

As described above, combinatorial processing may include any processing that varies the processing in two or more regions 55 of a substrate 50. The combinatorial methodology, in embodiments described herein, may include multiple levels of screening to identify, for example, materials, process conditions, process ordering, or process integration for further variation and optimization. For example, in one embodiment herein, each combinatorial test substrate 65 is subjected to many different process conditions. FIG. 35, with reference to FIGS. 1 through 34, illustrates a diagram of combinatorial screening process 100 showing three levels of screening for the development of optimal OLED process conditions using combinatorial methodologies. As shown in FIG. 35, combinatorial screening process 100 includes primary screening process (110), secondary screening process (120), and tertiary screening process (130). Combinatorial screening process 100 is shown as a funnel in FIG. 35, where the primary screening (110) includes the largest number of samples of barrier layers and funneling down to the secondary screening (120) and the tertiary screening (130) where the least number of samples of the barrier layers are tested. The number of samples used at any of the screening levels may also be dependent on the substrate or tools used to process the samples.

In FIG. 35, for example, numerous material compositions (e.g., 18 spots or 46 spots on a single substrate, as shown in FIGS. 23A through 25B, where each spot is a unique material composition) are systematically explored (e.g., work function, refractive index, sheet resistance, reactivity) on a single substrate (e.g., combinatorial test substrate 65) during an initial primary screening process (110) to discover material properties (e.g., as a cathode layer 15, ET layer 20, emission layer 25, HT layer 30, and/or anode layer 35—shown in FIG. 5) at speeds that would otherwise be impossible using traditional methods and tools. In other words, in the embodiment shown in FIG. 35, primary screening process (110) is an initial screening that processes many samples to rule out materials for further screening (e.g., materials that are not suitable for use as an anode material in the device shown in FIG. 5). For example, according to one embodiment herein, HPC dip-coating apparatus 200 is used on coupons during primary screening process (110). Once the best materials, process conditions, or process integration are identified using initial combinatorial screening methods (e.g., during primary screening process (110)), that material is then scaled up to test the performance of that material and/or conditions during a secondary screening stage (e.g., secondary screening process (120)). For example, according to one embodiment herein, HPC dip-coating apparatus 200 is used on coupons during secondary screening process (120). In addition, according to one embodiment herein, wet processing system 300 is used on wafers during secondary screening process (120). Moreover, according to one embodiment herein, an optimal test structure is fabrication (as described below) to quickly and efficiently test the performance of the process conditions. Additional testing may take place during tertiary screening process (130). During tertiary screening process (130), for example, the materials and/or process conditions that were not filtered out during primary screening process (110) and secondary screening process (120) are scaled up to a full-scale device size. For example, according to one embodiment herein, wet processing system 300 is used on wafers during secondary screening process (120). Furthermore, due to the performance tests that occurring in secondary screening process (120), materials and/or conditions that pass both the primary screening process (110) and secondary screening process (120) can rapidly proceed to tertiary screening process (130). Consequently, to test the performance of these material compositions, embodiments herein utilize an improved measurement tool to enable the collection of information more rapidly.

As described above, tertiary screening process (130) includes scaling materials and/or process conditions that pass both the primary screening process (110) and secondary screening process (120) up to full-scale devices (e.g., as shown in FIG. 5). As described above, the complete fabrication of OLED device 1 (shown in FIG. 5) is extremely expensive and time consuming using conventional systems. Consequently, according to one embodiment herein, fabrication and testing of OLED devices (e.g., OLED device 1 shown in FIG. 5) is postponed until tertiary screening process (130) occurs; that is after materials and/or process conditions have combinatorially undergone testing in primary screening process (110) and secondary screening process (120).

It should be appreciated that various other combinations of conventional and combinatorial processes can be included in the processing sequence with regard to FIG. 35. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates (e.g., wafers) or portions of monolithic substrates (e.g., as test coupons or wafer coupons).

FIG. 36, with reference to FIGS. 1 through 35, illustrates a flow diagram according to an embodiment herein. According to the method shown in FIG. 36, step 140 identifies a first sub-group of materials (e.g., primary screening process (110), using HPC dip-coating apparatus 200) from a group of varied materials during a primary combinatorial screening process (110), the first group of materials having a first set of characteristics. Step 145 characterizes the performance of the first sub-group of materials deposited on a substrate 65 (e.g., as shown in FIGS. 23A and 23B). Step 150 selects a second sub-group of materials (e.g., secondary screening process (120), using wet processing system 300) based on the performance of the first sub-group of materials (e.g., as shown in FIGS. 24A, 24B, and 29). Next, the method of FIG. 36 integrates, in step 155, the second sub-group of materials (e.g., secondary screening processes (120)) into devices to test the performance of the devices during a tertiary combinatorial screening process (tertiary screening process 130).

FIG. 37, with reference to FIGS. 1 through 36, illustrates an alternative flow diagram according to an embodiment herein. According to the method shown in FIG. 30, step 160 includes providing a substrate (e.g., substrate 40). Step 165 includes processing the regions (e.g., process conditions 55) on the substrate (e.g., substrate 40) by combinatorially varying at least one of materials, unit processes, and process sequences. Step 170 performs a first characterization test on the processed regions (e.g., process conditions 55) on the substrate (substrate 40) to generate first results. Step 175 includes performing a second characterization test on the processed regions (e.g., process conditions 55) on the substrate (e.g. substrate 40) to generate second results bases on the results of the first characterization test. Step 180 includes determining whether the substrate 40 meets a predetermined quality threshold based on at least on of the first results and the second results. In step 185, the method of FIG. 37 integrates at least one of the materials, process conditions, unit processes, and process sequences into the production of an OLED device (e.g., OLED device 1) based on the determination of step 180.

The combinatorial screening process shown in FIG. 35 and incorporated in FIGS. 1 through 34, 36, and 37 may be automated using computerized techniques. A representative hardware environment for practicing the automated embodiments is depicted in FIG. 38. This schematic drawing illustrates a hardware configuration of information handling/computer system 500 in accordance with the embodiments herein. The system 500 comprises at least one processor or central processing unit (CPU) 510. The CPUs 510 are interconnected via system bus 512 to various devices such as a random access memory (RAM) 514, read-only memory (ROM) 516, and an input/output (I/O) adapter 518. The I/O adapter 518 can connect to peripheral devices, such as disk units 511 and tape drives 513, or other program storage devices that are readable by the system. The system can read the inventive instructions on the program storage devices and follow these instructions to execute the methodology of the embodiments herein. The system further includes a user interface adapter 519 that connects a keyboard 515, mouse 517, speaker 524, microphone 522, and/or other user interface devices such as a touch screen device (not shown) to the bus 512 to gather user input. Additionally, a communication adapter 520 connects the bus 512 to a data processing network 525, and a display adapter 521 connects the bus 512 to a display device 523 which may be embodied as an output device such as a monitor, printer, or transmitter, for example.

As described above, R&D into new areas of technology are only as good as the systems and methods available during the discovery process. While implementing a comprehensive DOE matrix using conventional systems is a time-consuming and labor-intensive process, embodiments herein offer considerable efficiencies (e.g., in terms of time and cost) during the execution of the DOE matrix (e.g., DOE matrix 1000 as shown in FIG. 1). For example, the embodiments herein provide a significant reduction in technician's time spend on each process condition (e.g., process condition 55 shown in FIGS. 23A through 25B) by test automation. Moreover, the test time is significantly reduced by parallel testing by measuring multiple sites at the same time instead of measuring one at a time (e.g., as shown in FIGS. 29 through 34).

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method for evaluating materials, process conditions, unit processes, and process sequences for organic light emitting diode (OLED) device production, said method comprising:

providing a substrate comprising an organic semiconductor material deposited thereon;

processing regions on said substrate by combinatorially varying at least one of OLED materials from a group of varied OLED materials, process conditions, unit processes, and process sequences associated with said OLED device production on said substrate, wherein an OLED device comprises at least one of a packaging layer, a cathode layer, an emission layer, a hole transport (HT) layer, and an anode layer over said substrate;

performing a first characterization test on the processed regions on said substrate to generate first results;

performing a second characterization test on the processed regions on said substrate to generate second results based on said first results of said first characterization test;

determining whether at least one of said first results and said second results meet a predetermined quality threshold; and integrating said least one of OLED materials from a group of varied OLED materials, process conditions, unit processes, and process sequences associated with said OLED device production into production of an OLED device based on the determining process.

2. The method of claim 1, wherein said organic semiconductor comprises at least one of small molecule semiconductors, oligomer semiconductors, and organic polymer semiconductors.

3. The method of claim 2, wherein said small molecule semiconductor comprises at least one of pentacene, anthracene, and rubrene.

4. The method of claim 2, wherein said organic polymer semiconductor comprises at least one of poly(3-hexylthiophene), poly(p-phenylene vinylene), and derivatives of polyacetylene.

5. The method of claim 1,
wherein combinatorially varying at least one of OLED materials, process conditions, unit processes, and process sequences associated with said OLED device production comprises combinatorially varying materials of said substrate; and
wherein said substrate comprise at least one of glass, metal foils, and plastic.

6. The method of claim 1,
wherein combinatorially varying at least one of OLED materials, process conditions, unit processes, and process sequences associated with said OLED device production comprises combinatorially varying anode materials of said OLED device; and
wherein said anode materials comprise at least one of indium tin oxide (ITO), Al-doped ZnO (AZO), and $Zn_2SnO_4$ (ZTO).

7. The method of claim 1,
wherein combinatorially varying at least one of OLED materials, process conditions, unit processes, and process sequences associated with said OLED device production comprises combinatorially varying cathode materials of said OLED device; and
wherein said cathode materials comprise at least one of aluminum, magnesium, and barium.

8. The method of claim 1,
wherein combinatorially varying at least one OLED materials, process conditions, unit processes, and process sequences associated with said OLED device production comprises combinatorially varying process sequences comprising doping parameters for doping said organic semiconductor material; and
wherein said doping parameters comprise at least one of concentration and doping location.

9. The method of claim 1,
wherein combinatorially varying at least one of OLED materials, process conditions, unit processes, and process sequences associated with said OLED device production comprises combinatorially varying unit processes of producing said OLED device; and wherein said unit processes comprise at least one of gas flows, power density, substrate temperature, and precursor temperature.

10. The method of claim 1, wherein combinatorially varying at least one of OLED materials, process conditions, unit processes, and process sequences associated with said OLED device production comprises combinatorially varying process sequences comprising thermal treatments for producing said OLED device; and wherein said thermal treatments comprise at least one of temperature and time.

\* \* \* \* \*